(12) United States Patent
Ahn et al.

(10) Patent No.: US 11,551,775 B2
(45) Date of Patent: Jan. 10, 2023

(54) SEMICONDUCTOR MEMORY DEVICES AND MEMORY SYSTEMS INCLUDING THE SAME

(71) Applicant: SAMSUNG ELECTRONICS CO., LTD., Suwon-si (KR)

(72) Inventors: Sunggi Ahn, Jinju-si (KR); Yesin Ryu, Seoul (KR); Jun Jin Kong, Yongin-si (KR); Eunae Lee, Hwaseong-si (KR); Jihyun Choi, Daegu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/313,236

(22) Filed: May 6, 2021

(65) Prior Publication Data

US 2022/0122685 A1 Apr. 21, 2022

(30) Foreign Application Priority Data

Oct. 16, 2020 (KR) .................... 10-2020-0133848

(51) Int. Cl.
*G11C 29/14* (2006.01)
*G11C 29/42* (2006.01)
*G11C 29/46* (2006.01)
*G11C 29/52* (2006.01)
*G11C 29/12* (2006.01)

(52) U.S. Cl.
CPC .............. *G11C 29/42* (2013.01); *G11C 29/14* (2013.01); *G11C 29/46* (2013.01); *G11C 29/52* (2013.01); *G11C 2029/1202* (2013.01); *G11C 2029/1204* (2013.01)

(58) Field of Classification Search
CPC ......... G11C 29/42; G11C 29/14; G11C 29/46; G11C 29/52; G11C 2029/1202; G11C 2029/1204
See application file for complete search history.

(56) References Cited

U.S. PATENT DOCUMENTS

| | | |
|---|---|---|
| 6,751,756 B1 | 6/2004 | Hartnett et al. |
| 6,799,287 B1 | 9/2004 | Sharma et al. |
| 8,914,687 B2 | 12/2014 | Gold et al. |
| 8,954,828 B2 | 2/2015 | Torii et al. |
| 9,859,022 B2 | 1/2018 | Kim et al. |
| 10,044,475 B2 | 8/2018 | Chung et al. |
| 10,846,169 B2 * | 11/2020 | Cha ................ G11C 29/44 |

(Continued)

OTHER PUBLICATIONS

European Search Report dated Feb. 22, 2022.

*Primary Examiner* — Mohammed A Bashar
(74) *Attorney, Agent, or Firm* — Lee IP Law, P.C.

(57) ABSTRACT

A semiconductor memory device includes a memory cell array, an error correction code (ECC) circuit and a control logic circuit to control the ECC circuit. The memory cell array includes memory cells and a normal cell region and a parity cell region The ECC circuit, in a normal mode, receives a main data, performs an ECC encoding on the main data to generate a parity data and stores the main data and the parity data in the normal cell region and the parity cell region. The ECC circuit, in a test mode, receives a test data including at least one error bit, stores the test data in one of the normal cell region and the parity cell region and performs an ECC decoding on the test data and one of the main data and the parity data to provide a decoding result data to an external device.

20 Claims, 20 Drawing Sheets

(56) References Cited

U.S. PATENT DOCUMENTS

| | | | |
|---|---|---|---|
| 11,170,868 B2 * | 11/2021 | Ryu | G11C 7/1084 |
| 2016/0042809 A1 * | 2/2016 | Kim | G11C 29/44 |
| | | | 714/719 |
| 2017/0286197 A1 | 10/2017 | Halbert et al. | |
| 2019/0013085 A1 | 1/2019 | Benedict et al. | |
| 2019/0130991 A1 | 5/2019 | Son et al. | |

* cited by examiner

FIG. 13

|        | DQ1 | DQ2 | DQ3 | ... | DQk |
|--------|-----|-----|-----|-----|-----|
| EB_BL_SG1 | V | V | V | ... | V |
| EB_BL_SG2 | V | V | V | ... | V |
| EB_BL_SG3 | V | V | V | ... | V |
| ⋮ | ⋮ | ⋮ | ⋮ | ⋮ | ⋮ |
| EB_BL_SGk | V | V | V | V | V |

V=L : NO ERROR INJECTION

V=H : ERROR INJECTION

FIG. 14

|        | DQ1 | DQ2 | DQ3 | ... | DQk |
|--------|-----|-----|-----|-----|-----|
| EB_BL_SG1 | H | L | L | ... | L |
| EB_BL_SG2 | L | L | L | ... | L |
| EB_BL_SG3 | L | L | L | ... | L |
| ⋮ | ⋮ | ⋮ | ⋮ | ⋮ | ⋮ |
| EB_BL_SGk | L | L | L |   | L |

FIG. 15

|          | DQ1 | DQ2 | DQ3 | ... | DQk |
|----------|-----|-----|-----|-----|-----|
| EB_BL_SG1 | L | L | L | ... | L |
| EB_BL_SG2 | H | L | L | ... | L |
| EB_BL_SG3 | H | L | L | ... | L |
| ⋮ | ⋮ | ⋮ | ⋮ | ⋮ | ⋮ |
| EB_BL_SGk | L | L | L | ... | L |

FIG. 16

|          | DQ1 | DQ2 | DQ3 | ... | DQk |
|----------|-----|-----|-----|-----|-----|
| EB_BL_SG1 | L | L | H | ... | L |
| EB_BL_SG2 | L | L | H | ... | L |
| EB_BL_SG3 | L | L | H | ... | L |
| ⋮ | ⋮ | ⋮ | ⋮ | ⋮ | ⋮ |
| EB_BL_SGk | L | L | H | ... | L |

SEMICONDUCTOR MEMORY DEVICES AND MEMORY SYSTEMS INCLUDING THE SAME

CROSS-REFERENCE TO RELATED APPLICATION

Korean Patent Application No. 10-2020-0133848, filed on Oct. 16, 2020, in the Korean Intellectual Property Office, and entitled: "Semiconductor Memory Devices and Memory Systems Including the Same," is incorporated by reference herein in its entirety.

BACKGROUND

1. Field

Embodiments relate to memories, and more particularly to semiconductor memory devices and memory systems including the same.

2. Description of the Related Art

Semiconductor memory devices may be classified into non-volatile memory devices such as flash memory devices and volatile memory devices such as DRAMs. High speed operation and cost efficiency of DRAMs make it possible for DRAMs to be used for system memories.

SUMMARY

Embodiments are directed to a semiconductor memory device, including: a memory cell array including a plurality of volatile memory cells coupled to a plurality of word-lines and a plurality of bit-lines, the memory cell array including a normal cell region and a parity cell region; an error correction code (ECC) circuit; and a control logic circuit configured to control the ECC circuit. The ECC circuit may be configured to: in a normal mode, receive a main data including normal data bits from an external device, the main data accompanied by a first command; perform an ECC encoding on the main data to generate a parity data; and store the main data and the parity data in the normal cell region and the parity cell region, respectively, and, in a test mode, receive a test data including at least one error bit from the external device, the test data accompanied by a second command; store the test data in one of the normal cell region and the parity cell region; and perform an ECC decoding on the test data and one of the main data and the parity data in response to a read command to provide a decoding result data to the external device.

Embodiments are also directed to a semiconductor memory device, including: a memory cell array including a plurality of volatile memory cells coupled to a plurality of word-lines and a plurality of bit-lines, the memory cell array including a normal cell region and a parity cell region; an error correction code (ECC) circuit including a storage; and a control logic circuit configured to control the ECC circuit. The ECC circuit may be configured to: in a normal mode, receive a main data including normal data bits from an external device, the main data accompanied by a first command; perform an ECC encoding on the main data to generate a parity data; and store the main data and the parity data in a selected one of the storage and the memory cell array, and, in a test mode, receive a test data including at least one error bit from the external device, the test data accompanied by a second command; store the test data in the selected one of the storage and the memory cell array; and perform an ECC decoding on the test data and one of the main data and the parity data in response to a read command to provide a decoding result data to the external device.

Embodiments are also directed to a memory system, including: a semiconductor memory device; and a memory controller configured to control the semiconductor memory device. The semiconductor memory device may includes: a memory cell array including a plurality of volatile memory cells coupled to a plurality of word-lines and a plurality of bit-lines, the memory cell array including a normal cell region and a parity cell region; an error correction code (ECC) circuit; and a control logic circuit configured to control the ECC circuit. The ECC circuit may be configured to: in a normal mode, receive a main data including normal data bits from the memory controller, the main data accompanied by a first command; perform an ECC encoding on the main data to generate a parity data; and store the main data and the parity data in the normal cell region and the parity cell region, respectively, and, in a test mode, receive a test data including at least one error bit from the memory controller, the test data accompanied by a second command; store the test data in one of the normal cell region and the parity cell region respectively; and perform an ECC decoding on the test data and one of the main data and the parity data in response to a read command to provide a decoding result data to the memory controller.

BRIEF DESCRIPTION OF THE DRAWINGS

Features will become apparent to those of skill in the art by describing in detail example embodiments with reference to the attached drawings in which:

FIG. 13 illustrates second data bits that may be stored in the error injection register set in FIG. 4.

FIGS. 14 through 16 illustrate various error patterns that the error injection register set may represent according to example embodiments.

DETAILED DESCRIPTION

Figure 1:
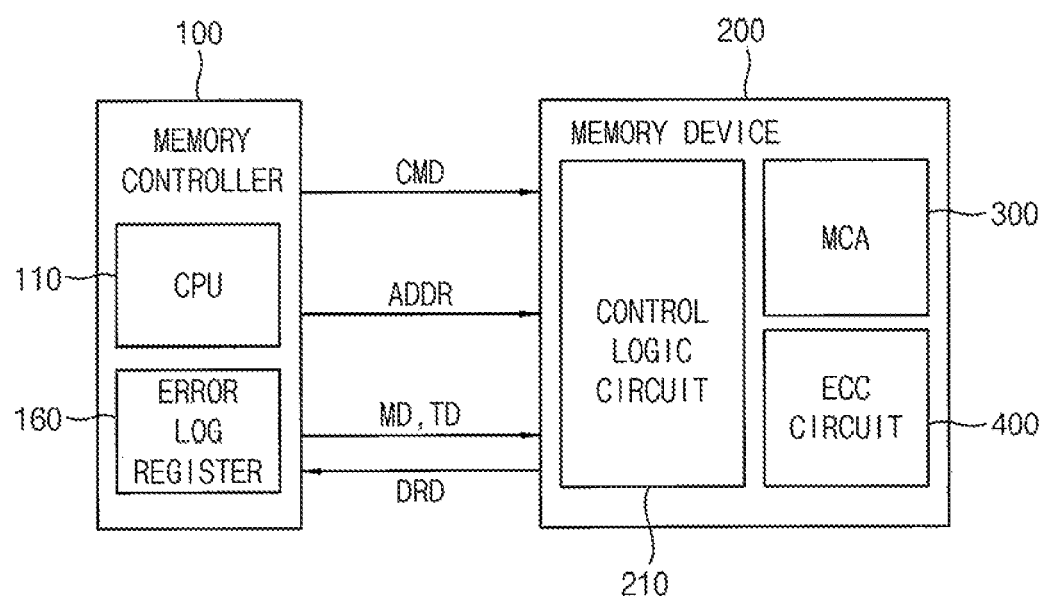
FIG. 1 is a block diagram illustrating a memory system according to example embodiments.

FIG. 1 is a block diagram illustrating a memory system according to example embodiments.

Referring to FIG. 1, a memory system 20 may include a memory controller 100 and a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to request from the host. In addition, the memory controller 100 may issue operation commands to the semiconductor memory device 200 for controlling the semiconductor memory device 200. The memory controller 100 may be referred to as an external device.

In some example embodiments, the semiconductor memory device 200 may be a memory device including dynamic memory cells such as a dynamic random access memory (DRAM), double data rate 4 (DDR4) synchronous DRAM (SDRAM), or a low power DDR5 (LPDDR4) SDRAM.

The memory controller 100 may transmit a command CMD and an address (signal) ADDR to the semiconductor memory device 200, transmit a main data MD to the semiconductor memory device 200 in a normal mode, and transmit a test data TD including at least one error bit to the semiconductor memory device 200 and receive a decoding result data from the semiconductor memory device 200 in a test mode.

The memory controller 100 may include a central processing unit (CPU) 110 and an error log register 160.

The semiconductor memory device 200 may include a memory cell array 300 (which stores the main data MD and the test data TD), an error correction code (ECC) circuit 400, and a control logic circuit 210.

The control logic circuit 210 may control access to the memory cell array 300, and may control the ECC circuit 400 based on the command CMD and the address ADDR. The memory cell array 300 may include a normal cell region and a parity cell region.

The ECC circuit 400, in a normal mode, may receive the main data MD accompanied by a first command, which includes normal data bits from the memory controller 100, may perform an ECC encoding on the main data to generate a parity data, and may store the main data MD and the parity data in the normal cell region and the parity cell region, respectively.

The ECC circuit 400, in a test mode, may receive the test data TD accompanied by a second command, which includes at least one error bit from the memory controller 100, may store the test data TD in one of the normal cell region and the parity cell region, respectively, and may perform an ECC decoding on the test data TD and one of the main data MD and the parity data in response to a read command to provide the decoding result data DRD to the memory controller 100.

The memory controller 100 may record error information of the ECC circuit 400 and the memory cell array 300 associated with various error patterns in the error log register 160.

Figure 2:
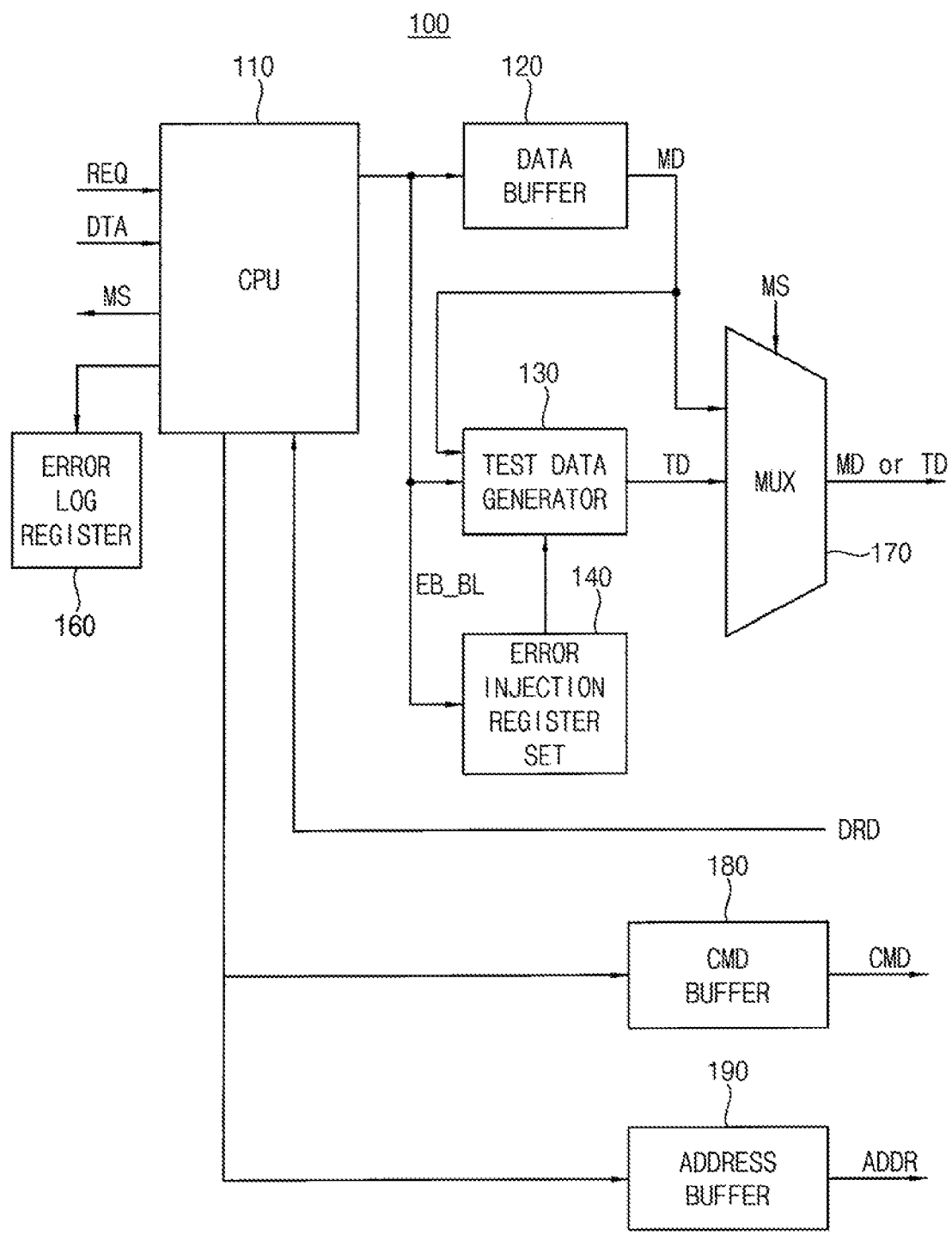
FIG. 2 is a block diagram illustrating an example of the memory controller in the memory system of FIG. 1 according to example embodiments.

FIG. 2 is a block diagram illustrating an example of the memory controller in the memory system of FIG. 1 according to example embodiments.

Referring to FIG. 2, the memory controller 100 may include the CPU 110, a data buffer 120, a test data generator 130, an error injection register set 140, the error log register 160, a multiplexer 170, a command buffer 180, and an address buffer 190.

The CPU 110 may receive a request REQ and a data DTA from the host, and provide the data DTA to the data buffer 120. The CPU 110 may control the data buffer 120, the test data generator 130, the error injection register set 140, the multiplexer 170, the command buffer 180, and the address buffer 190

The data buffer 120 may buffer the data DTA to provide the main data MD to the test data generator 130 and the multiplexer 170. The error injection register set 140 may store an error bit set EB_BL including at least one error bit, and the error bit set EB_BL may be associated with the test data TD to be provided to the semiconductor memory device 200.

The test data generator 130 may generate the test data (set) TD based on the main data MD and the error bit set EB_BL, and may provide the test data TD to the multiplexer 170.

The multiplexer 170 may receive the main data MD and the test data TD, may select the main data MD to provide the main data MD to the semiconductor memory device 200 in the normal mode, and may select the test data TD to provide the test data TD to the semiconductor memory device 200 in the test mode, in response to a mode signal MS from the CPU 110.

The command buffer 180 may store the command CMD corresponding to the request REQ, and transmit the command CMD to the semiconductor memory device 200 under control of the CPU 110.

The address buffer 190 may store the address ADDR and transmit the address ADDR to the semiconductor memory device 200 under control of the CPU 110.

Figure 3:
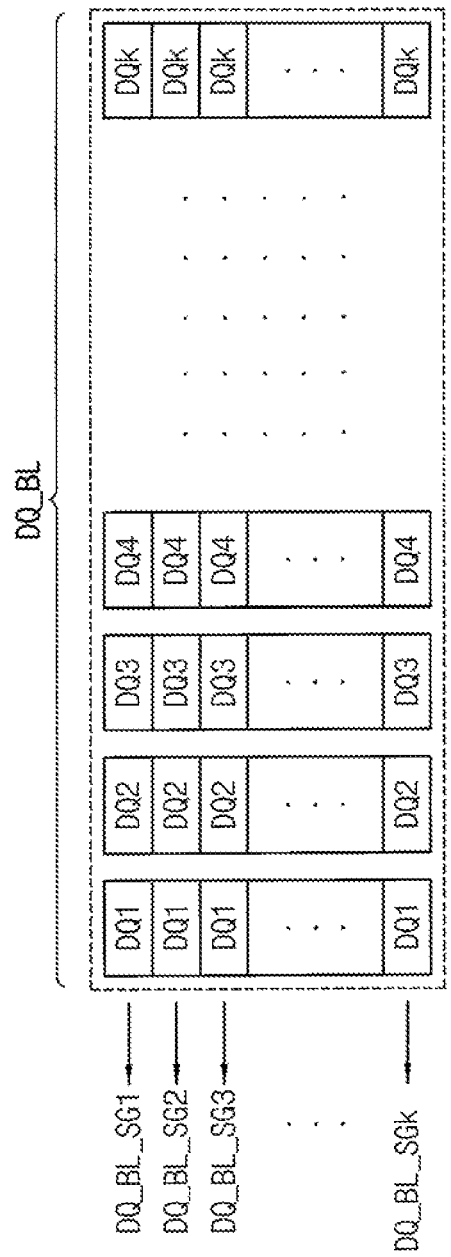
FIG. 3 illustrates data set corresponding to a plurality of burst lengths in the memory system of FIG. 1 according to example embodiments.

FIG. 3 illustrates a data set corresponding to a plurality of burst lengths in the memory system of FIG. 1 according to example embodiments.

Referring to FIG. 3, a data set DQ_BL corresponding to a plurality of burst lengths are input to/output from the semiconductor memory device 200. The data set DQ_BL includes data segments DQ_BL_SG1~DQ_BL_SGk each corresponding to each of the plurality of burst lengths, where k is an integer greater than three. The data set DQ_BL corresponding to the plurality of burst lengths may be stored in the memory cell array 300 of the semiconductor memory device 200. The data set DQ_BL may include the main data MD and the test data TD.

Figure 4:
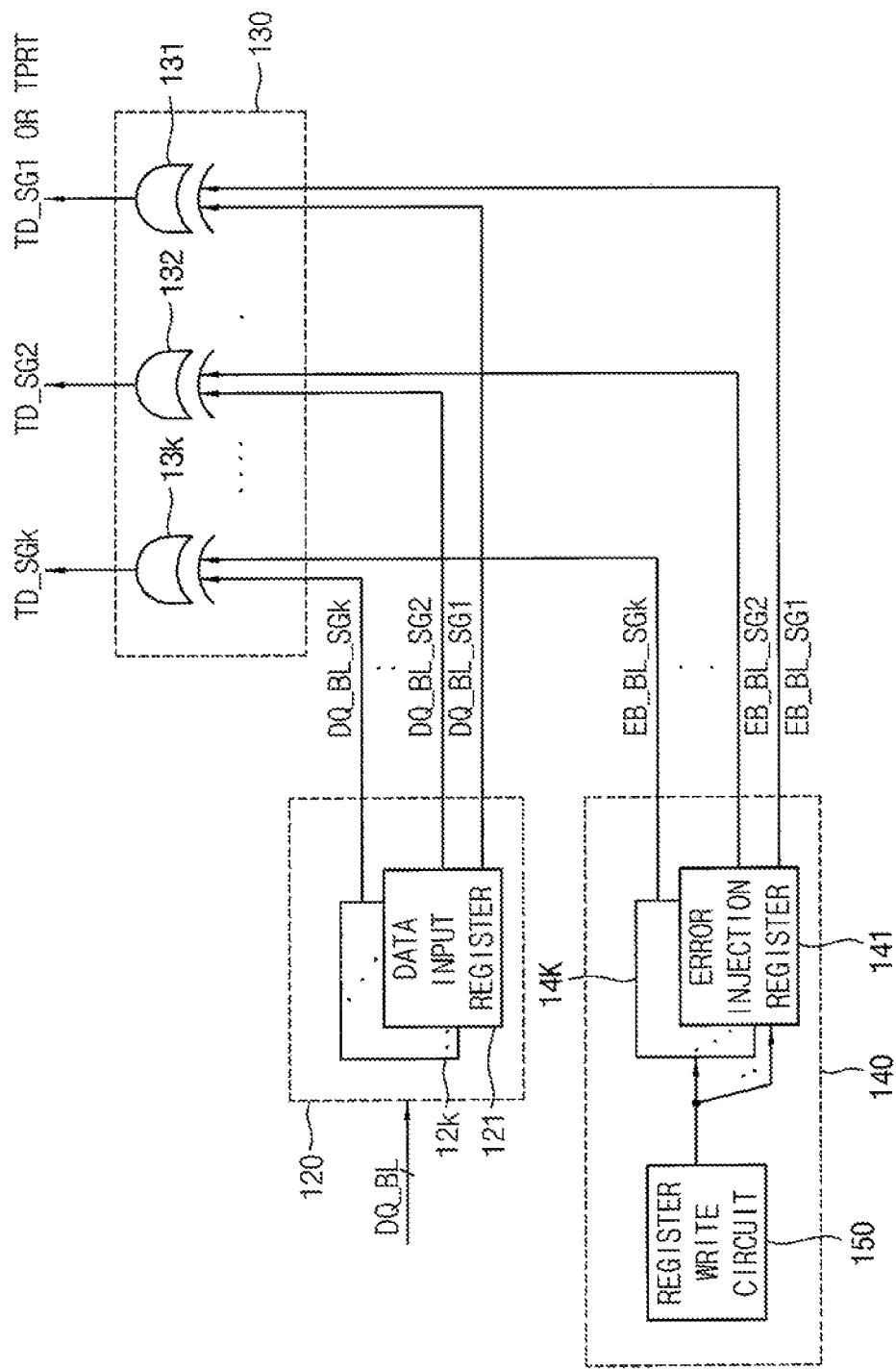
FIG. 4 illustrates the error injection register set, the data buffer, and the test data generator in the memory controller of FIG. 2 according to example embodiments.

FIG. 4 illustrates the error injection register set, the data buffer, and the test data generator in the memory controller of FIG. 2 according to example embodiments.

Referring to FIG. 4, the error injection register set 140 may include a register write circuit 150 and a plurality of error injection registers 14*l*~14*k*.

The data buffer 120 may include a plurality of data input registers 12*l*~12*k*. Each of the data input registers 12*l*~12*k* may store corresponding one of first units of first data bits DQ_BL_SG1~DQ_BL_SGk, corresponding to a burst length of the semiconductor memory device 200, in the data set DQ_BL. Each of the data input registers 12*l*~12*k* may provide the test data generator 130 with corresponding one of first units of first data bits DQ_BL_SG1~DQ_BL_SGk in the data set DQ_BL.

Each of the error injection registers 14*l*~14*k* may store corresponding one of second units of second data bits EB_BL_SG1~EB_BL_SGk corresponding to each of the data input registers 12*l*~12*k* and corresponding to each of the first units of first data bits DQ_BL_SG1~DQ_BL_SGk. A size of the first unit may be the same as a size of the second unit.

The register write circuit 150 may maintain the second data bits stored in the error injection registers 14*l*~14*k* at a default level (e.g., a first logic level, e.g., a logic low level), or may change at least one of the second data bits to a second logic level based on a control of the CPU 110.

The test data generator 130 may include a plurality of exclusive OR gates 13*l*~13*k*.

The plurality of exclusive OR gates 13*l*~13*k* may perform an exclusive OR operation on corresponding data bits of the first units of first data bits DQ_BL_SG1~DQ_BL_SGk and the second units of second data bits EB_BL_SG1~EB_BL_SGk, respectively, to generate test data TD_SG1~TD_SGk. The test data TD_SG1~TD_SGk may include a test main data or test parity data TPRT.

Figure 5:
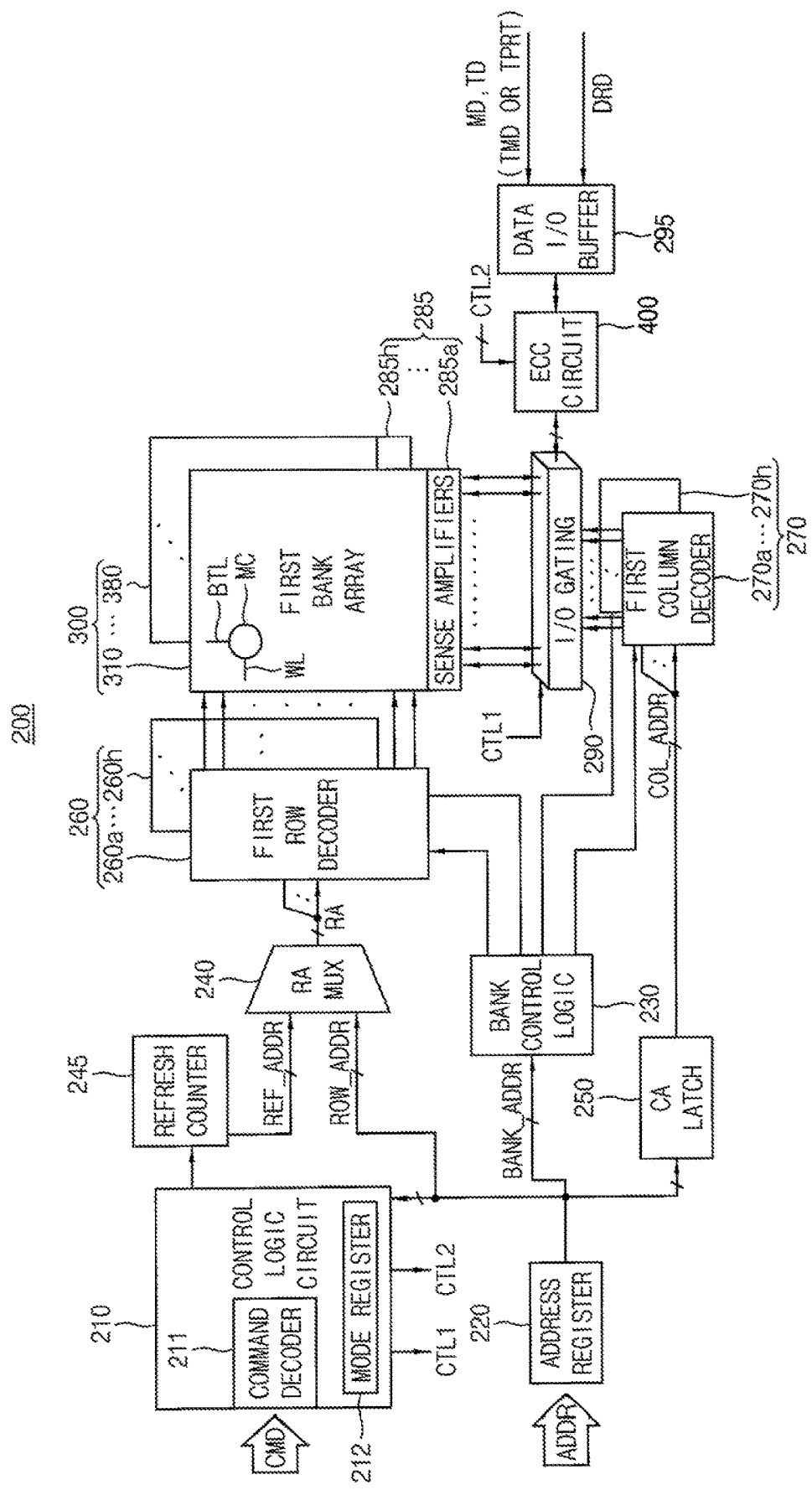
FIG. 5 is a block diagram illustrating an example of the semiconductor memory device in the memory system of FIG. 1 according to example embodiments.

FIG. 5 is a block diagram illustrating an example of the semiconductor memory device in the memory system of FIG. 1 according to example embodiments.

Referring to FIG. 5, the semiconductor memory device 200 may include the control logic circuit 210, an address register 220, a bank control logic 230, a row address multiplexer 240, a refresh counter 245, a column address latch 250, a row decoder 260, a column decoder 270, a sense amplifier unit 285, an input/output (I/O) gating circuit 290, a data I/O buffer 295, the memory cell array 300, and the ECC circuit 400.

The memory cell array 300 may includes first through eighth bank arrays 310~380. The row decoder 260 may include first through eighth bank row decoders 260*a*-260*h* respectively coupled to the first through eighth bank arrays 310~380. The column decoder 270 may include first through eighth bank column decoders 270*a*-270*h* respectively coupled to the first through eighth bank arrays 310~380. The sense amplifier unit 285 may include first through eighth bank sense amplifiers 285*a*-285*h* respectively coupled to the first through eighth bank arrays 310~380.

The first through eighth bank arrays 310~380, the first through eighth bank row decoders 260*a*-260*h*, the first through eighth bank column decoders 270*a*-270*h*, and the first through eighth bank sense amplifiers 285*a*-285*h* may form first through eighth banks. Each of the first through eighth bank arrays 310~380 may include a plurality of volatile memory cells MC formed at intersections of a plurality of word-lines WL and a plurality of bit-line BTL.

The address register 220 may receive the address ADDR including a bank address BANK_ADDR, a row address ROW_ADDR, and a column address COL_ADDR from the memory controller 100. The address register 220 may provide the received bank address BANK_ADDR to the bank control logic 230, provide the received row address ROW_ADDR to the row address multiplexer 240, and provide the received column address COL_ADDR to the column address latch 250.

The bank control logic 230 may generate bank control signals in response to the bank address BANK_ADDR. One of the first through eighth bank row decoders 260*a*-260*h* corresponding to the bank address BANK_ADDR is activated in response to the bank control signals, and one of the first through eighth bank column decoders 270*a*-270*h* corresponding to the bank address BANK_ADDR is activated in response to the bank control signals.

The row address multiplexer 240 may receive the row address ROW_ADDR from the address register 220, and receive a refresh row address REF ADDR from the refresh counter 245. The row address multiplexer 240 may selectively output the row address ROW_ADDR or the refresh row address REF ADDR as a row address RA. The row address RA that is output from the row address multiplexer 240 may be applied to the first through eighth bank row decoders 260*a*-260*h*. The refresh counter 245 may sequentially output the refresh row address REF ADDR under control of the control logic circuit 210. When the command CMD from the memory controller 100 corresponds to an auto refresh command or a self-refresh entry command, the control logic circuit 210 may control the refresh counter 245 to output the refresh row address REF ADDR sequentially.

The activated one of the first through eighth bank row decoders 260*a*-260*h* (activated by the bank control logic 230) may decode the row address RA that is output from the row address multiplexer 240, and activate a word-line corresponding to the row address RA. For example, the activated bank row decoder may apply a word-line driving voltage to the word-line corresponding to the row address RA.

The column address latch 250 may receive the column address COL_ADDR from the address register 220, and temporarily stores the received column address COL_ADDR. In some example embodiments, in a burst mode, the column address latch 250 may generate column addresses that increment from the received column address COL_ADDR. The column address latch 250 may apply the temporarily stored or generated column address to the first through eighth bank column decoders 270*a*-270*h*.

The activated one of the first through eighth bank column decoders 270*a*-270*h* may activate a sense amplifier corresponding to the bank address BANK_ADDR and the column address COL_ADDR' or a target scrubbing column address TSCA through the I/O gating circuit 290.

The I/O gating circuit 290 may include circuitry for gating input/output data, and may further include input data mask logic, read data latches for storing data that is output from the first through eighth bank arrays 310~380, and write drivers for writing data to the first through eighth bank arrays 310~380.

A codeword read from one bank array of the first through eighth bank arrays 310~380 may be sensed by a sense amplifier coupled to the one bank array from which the data is to be read, and may be stored in the read data latches. The codeword stored in the read data latches may be provided to the memory controller 100 via the data I/O buffer 295 after ECC decoding is performed on the codeword by the ECC circuit 400.

The main data MD to be written in one bank array of the first through eighth bank arrays 310~380 may be provided to the data I/O buffer 295 from the memory controller 100, may be provided to the ECC circuit 400 from the data I/O buffer 295. The ECC circuit 400 may perform an ECC encoding on the main data MD to generate parity data. The ECC circuit 400 may provide the main data MD and the parity data to the I/O gating circuit 290. The I/O gating circuit 290 may write the main data MD and the parity data in a sub-page of a target page in one bank array through the write drivers.

The data I/O buffer 295 may provide the main data MD from the memory controller 100 to the ECC circuit 400 in a write operation of a normal mode of the semiconductor memory device 200, and may provide one of a test main data TMD including at least one error bit and a test parity data TPRT including at least one error bit from the memory controller 100 to the ECC circuit 400 in a write operation of a test mode of the semiconductor memory device 200.

The ECC circuit 400, in the write operation of the normal mode, may receive the main data MD accompanied by a first command (which includes normal data bits) from the memory controller 100, may perform an ECC encoding on the main data to generate the parity data, and may store the main data MD and the parity data in the normal cell region and the parity cell region of a target bank, respectively.

The ECC circuit 400, in a test mode, may receive one of the test main data TMD (including the at least one error bit and the test parity data TPRT including at least one error bit accompanied by a second command) from the memory controller 100, and may store one of the test main data TMD and the test parity data TPRT in one of the normal cell region and the parity cell region of the target bank array. The second command may be activated by setting a test mode register set.

When the test mode designates a first sub test mode, the ECC circuit 400 may store the test parity data TPRT in the parity cell region of the target bank array, may read the main data MD stored in the normal cell region and the test parity data TPRT in the parity cell region in a read operation in response to a read command, may perform the ECC decoding on the main data MD and the test parity data TPRT to generate the decoding result data DRD, and may provide the decoding result data DRD to the memory controller 100 through the data I/O buffer 295.

When the test mode designates a second sub test mode, the ECC circuit 400 may store the test main data TMD in the normal cell region of the target bank array, may read the test main data TMD stored in the normal cell region and the parity data in the parity cell region in a read operation in response to a read command, may perform the ECC decoding on the test main data TMD and the parity data to generate the decoding result data DRD, and may provide the decoding result data DRD to the memory controller 100 through the data I/O buffer 295.

The control logic circuit 210 may control operations of the semiconductor memory device 200. For example, the control logic circuit 210 may generate control signals for the semiconductor memory device 200 in order to perform a write operation or a read operation. The control logic circuit 210 may include a command decoder 211, which decodes the command CMD received from the memory controller 100, and a mode register 212, which sets an operation mode of the semiconductor memory device 200.

The command decoder 211 may generate the control signals corresponding to the command CMD by decoding a write enable signal, a row address strobe signal, a column address strobe signal, a chip select signal, etc.

The control logic circuit 210 may generate a first control signal CTL1 to control the I/O gating circuit 290 and a second control signal CTL2 to control the ECC circuit 400.

Figure 6:
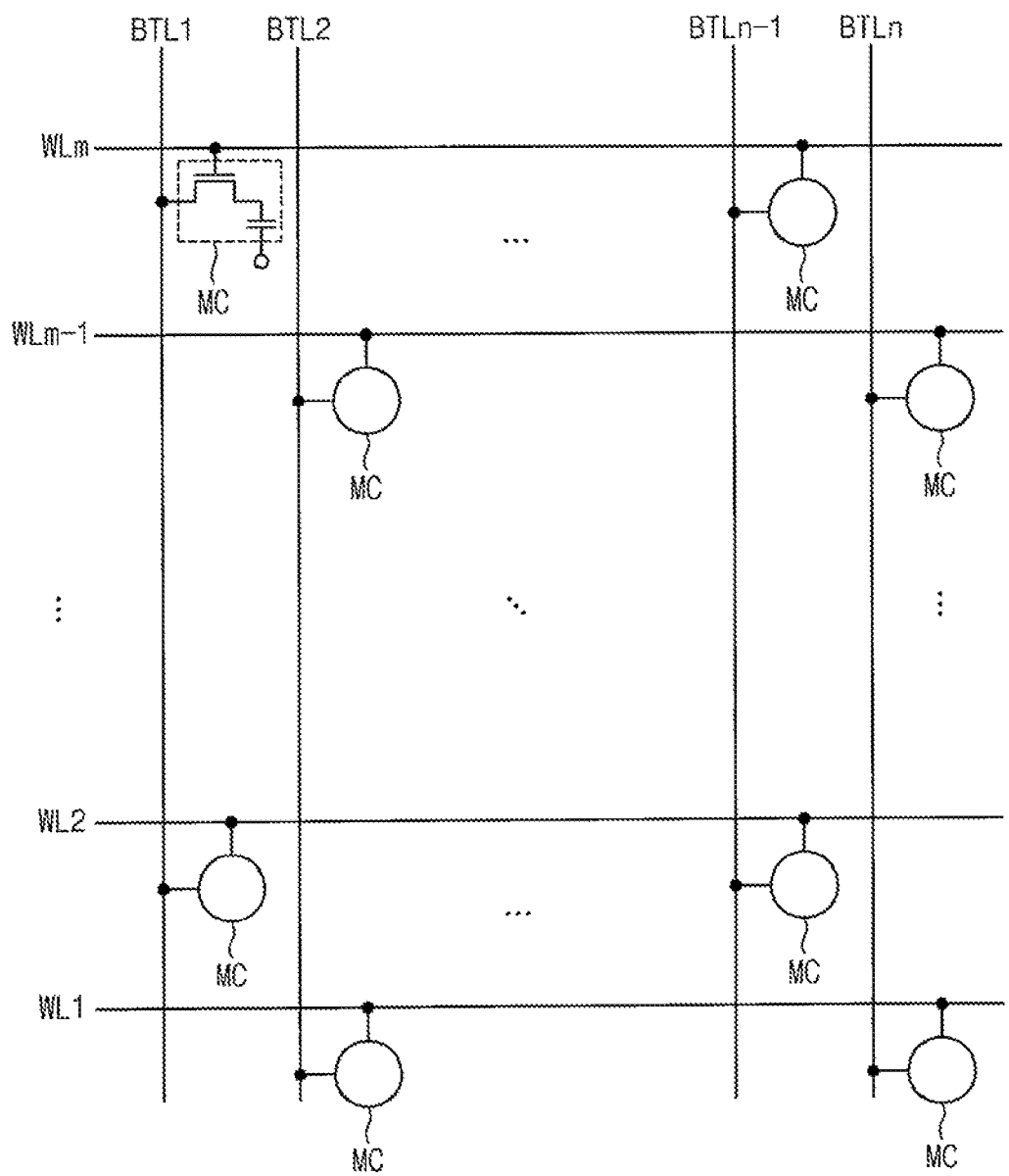
FIG. 6 illustrates an example of the first bank array in the semiconductor memory device of FIG. 5.

FIG. 6 illustrates an example of the first bank array in the semiconductor memory device of FIG. 5.

Referring to FIG. 6, the first bank array 310 may include a plurality of word-lines WL1~WLm (m is a natural number greater than two), a plurality of bit-lines BTL1~BTLn (n is a natural number greater than two), and a plurality of volatile memory cells MCs disposed at intersections of the word-lines WL1~WLm and the bit-lines BTL1~BTLn. Each of the memory cells MCs may include a cell transistor coupled to each of the word-lines WL1~WLm and each of the bit-lines BTL1~BTLn, and may include a cell capacitor coupled to the cell transistor.

Figure 7:
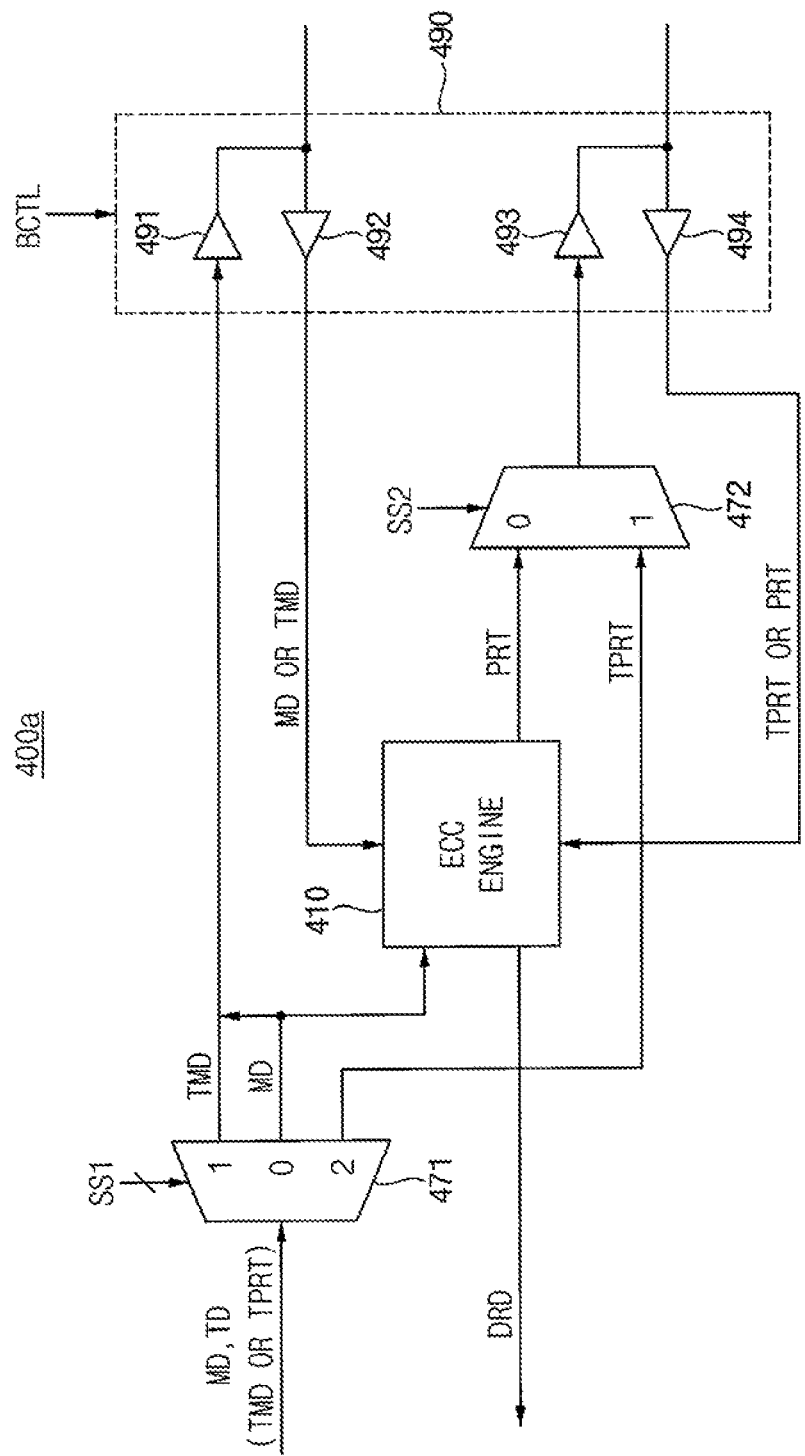
FIG. 7 is a block diagram illustrating an example of the ECC circuit in the semiconductor memory device of FIG. 5 according to example embodiments.

FIG. 7 is a block diagram illustrating an example of the ECC circuit in the semiconductor memory device of FIG. 5 according to example embodiments.

Referring to FIG. 7, an ECC circuit 400a may include an ECC engine 410, a demultiplexer 471, a multiplexer 472, and a buffer circuit 490.

The buffer circuit 490 may include buffers 491, 492, 493 and 494. The buffers 491, 492, 493 and 494 may be controlled by a buffer control signal BCTL.

The demultiplexer 471, in a normal mode, may receive the main data MD, and may provide the main data MD to the ECC engine 410 and the buffer 491 in response to a first selection signal SS1.

The demultiplexer 471, in a test mode, may receive one of the test main data TMD and the test parity data TPRT.

When the demultiplexer 471 receives the test parity data TPRT in the test mode, the demultiplexer 471 may provide the test parity data TPRT to the multiplexer 472 in response to the first selection signal SS1.

When the demultiplexer 471 receives the test main data TMD in the test mode, the demultiplexer 471 may provide the test main data TMD to the buffer 491 of the buffer circuit 490 in response to the first selection signal SS1.

The ECC engine 410 may perform an ECC encoding on the main data MD to generate the parity data PRT in the normal mode, and provide the parity data PRT to the multiplexer 472.

The multiplexer 472 may provide the parity data PRT to the buffer 493 of the buffer circuit 490 in response to a second selection signal SS2 in the normal mode, and may provide the test parity data TPRT to the buffer 493 of the buffer circuit 490 in response to the second selection signal SS2 in the test mode when the test mode designates the first sub test mode.

The buffer circuit 490 may be coupled to the I/O gating circuit 290 in FIG. 5.

The buffer 491 may provide the main data MD to the I/O gating circuit 290 in the normal mode, and provide the test parity data TPRT to the I/O gating circuit 290 in the test mode when the test mode designates the first sub test mode.

The buffer 492 may provide the main data MD from the I/O gating circuit 290 to the ECC engine 410 in the first sub test mode of the test mode, and provide the test main data TMD from the I/O gating circuit 290 to the ECC engine 410 in the second sub test mode of the test mode.

The buffer 493 may provide the parity data PRT from the multiplexer 472 to the I/O gating circuit 290 in the first sub test mode, and provide the test parity data TPRT from the multiplexer 472 to the I/O gating circuit 290 in the second sub test mode.

The buffer 494 may provide the test parity data TPRT from the I/O gating circuit 290 to the ECC engine 410 in the first sub test mode, and provide the parity data PRT from the I/O gating circuit 290 to the ECC engine 410 in the second sub test mode.

The ECC engine 410, in the first sub test mode, may perform the ECC decoding on the main data MD read from the normal cell region and the test parity data TPRT read from the parity cell region to generate the decoding result data DRD, and may provide the decoding result data DRD to the memory controller 100 through the data I/O buffer 295.

The ECC engine 410, in the second sub test mode, may perform the ECC decoding on the test main data TMD read from the normal cell region and the parity data PRT read from the parity cell region to generate the decoding result data DRD, and may provide the decoding result data DRD to the memory controller 100 through the data I/O buffer 295.

Since the test parity data TPRT read from the parity cell region includes at least one error bit in the first sub test mode and the test main data TMD read from the normal cell region includes at least one error bit in the second sub test mode, the decoding result data DRD may indicate a result of the ECC decoding based on the at least one error bit. The at least one error bit may include one of a single bit error, a double bit error, a symbol error, and a data I/O pad error according to user's selection.

In FIG. 7, the first selection signal SS1, the second selection signal SS2, and the buffer control signal BCTL may be included in the second control signal CTL2 in FIG. 5.

Figure 8:
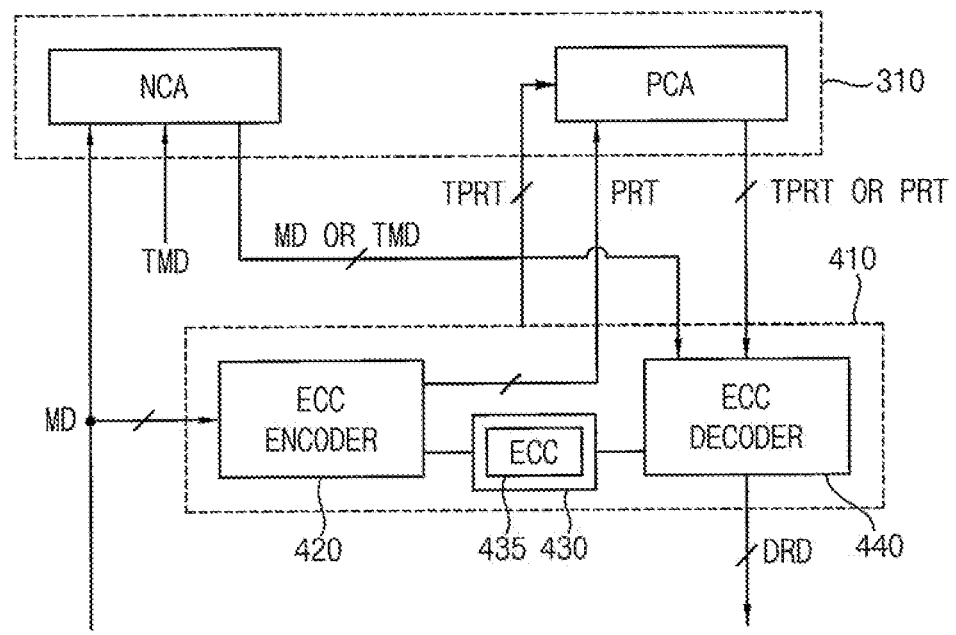
FIG. 8 is a block diagram illustrating an example of the ECC engine in the ECC circuit of FIG. 7 according to example embodiments.

FIG. 8 is a block diagram illustrating an example of the ECC engine in the ECC circuit of FIG. 7 according to example embodiments.

In FIG. 8, the first bank array 310 is illustrated together for convenience of explanation. The first bank array 310 may include a normal cell region NCA and a parity cell region PCA.

Referring to FIG. 8, the ECC engine 410 may include an ECC encoder 420, an ECC decoder 440, and an (ECC) memory 430. The ECC memory 430 may store an ECC 435.

The ECC encoder 420 may be coupled to the ECC memory 430, and may generate parity data PRT associated with the main data MD to be stored in the normal cell region NCA of the first bank array 310 in the normal mode. The parity data PRT may be stored in the parity cell region PCA of the first bank array 310.

In the first sub test mode, the test parity data TPRT may be stored in the parity cell region PCA of the first bank array 310. In the second sub test mode, the test main data TMD may be stored in the normal cell region NCA of the first bank array 310.

The ECC decoder 440 may be coupled to the ECC memory 430. The ECC decoder 440 may perform an ECC decoding on the main data MD and the test parity data TPRT read from the first bank array 310 by using the ECC 435 to generate the decoding result data DRD in the first sub test mode. The ECC decoder 440 may perform an ECC decoding on the test main data TMD and the parity data PRT read from the first bank array 310 by using the ECC 435 to generate the decoding result data DRD in the second sub test mode.

Figure 9:
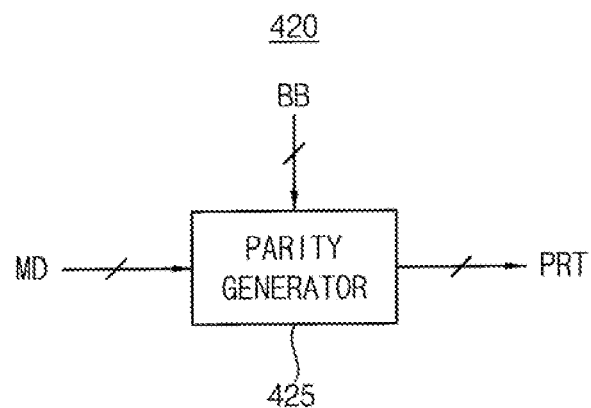
FIG. 9 illustrates an example of the ECC encoder in the ECC engine of FIG. 8 according to example embodiments.

FIG. 9 illustrates an example of the ECC encoder in the ECC engine of FIG. 8 according to example embodiments.

Referring to FIG. 9, the ECC encoder 420 may include a parity generator 425. The parity generator 425 may receive the main data MD and a basis bit BB, and generate the parity data PRT by performing, for example, an XOR array operation. The basis bit BB may be a bit for generating the parity data PRT with respect to the main data MD, and may include b'0000000. The basis bit BB may include other particular bits instead of b'0000000.

Figure 10:
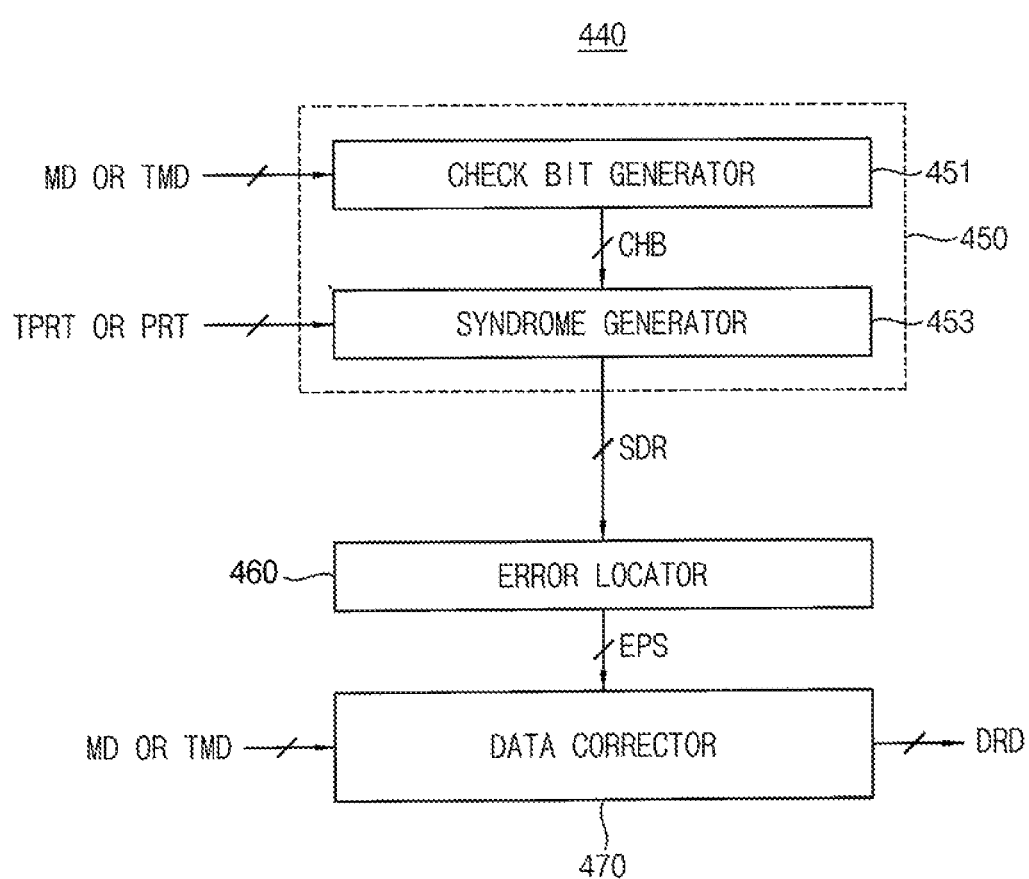
FIG. 10 illustrates an example of the ECC decoder in the ECC engine of FIG. 8 according to example embodiments.

FIG. 10 illustrates an example of the ECC decoder in the ECC engine of FIG. 8 according to example embodiments.

Referring to FIG. 10, the ECC decoder 440 may include a syndrome generation circuit 450, an error locator 460, and a data corrector 470. The syndrome generation circuit 450 may include a check bit generator 451 and a syndrome generator 453.

The check bit generator 451 may generate check bits CHB based on the main data MD by performing an XOR array operation in the first sub test mode, and based on the test main data TMD by performing an XOR array operation in the second sub test mode. The syndrome generator 453 may generate a syndrome SDR by comparing corresponding bits of the test parity data TPRT and the check bits CHB in the first sub test mode, and by comparing corresponding bits of the parity data PRT and the check bits CHB in the second sub test mode.

The error locator 460 may generate an error position signal EPS indicating a position of an error bit in the main data MD or the test main data TMD to provide the error position signal EPS to the data corrector 470 when all bits of the syndrome SDR are not 'zero'.

The data corrector 470 may receive the main data MD in the first sub test mode and receive the test main data TMD in the second sub test mode, corrects the error bit in the main data MD or the test main data TMD based on the error position signal EPS when the main data MD or the test main data TMD includes the error bit, and output the decoding output data DRD.

Since the data corrector 470 corrects error bits within an error correction capability of the ECC 435 based on the ECC 435, the data corrector 470 outputs the decoding output data DRD without correcting error bits when the main data MD or the test main data TMD includes error bits exceeding the error correction capability of the ECC 435.

Therefore, the memory controller 100 may determine error pattern of data of the ECC circuit 400, due to an intentional error bit included in the test parity data TPRT or the test main data TMD by analyzing the decoding result data DRD.

Figure 11:
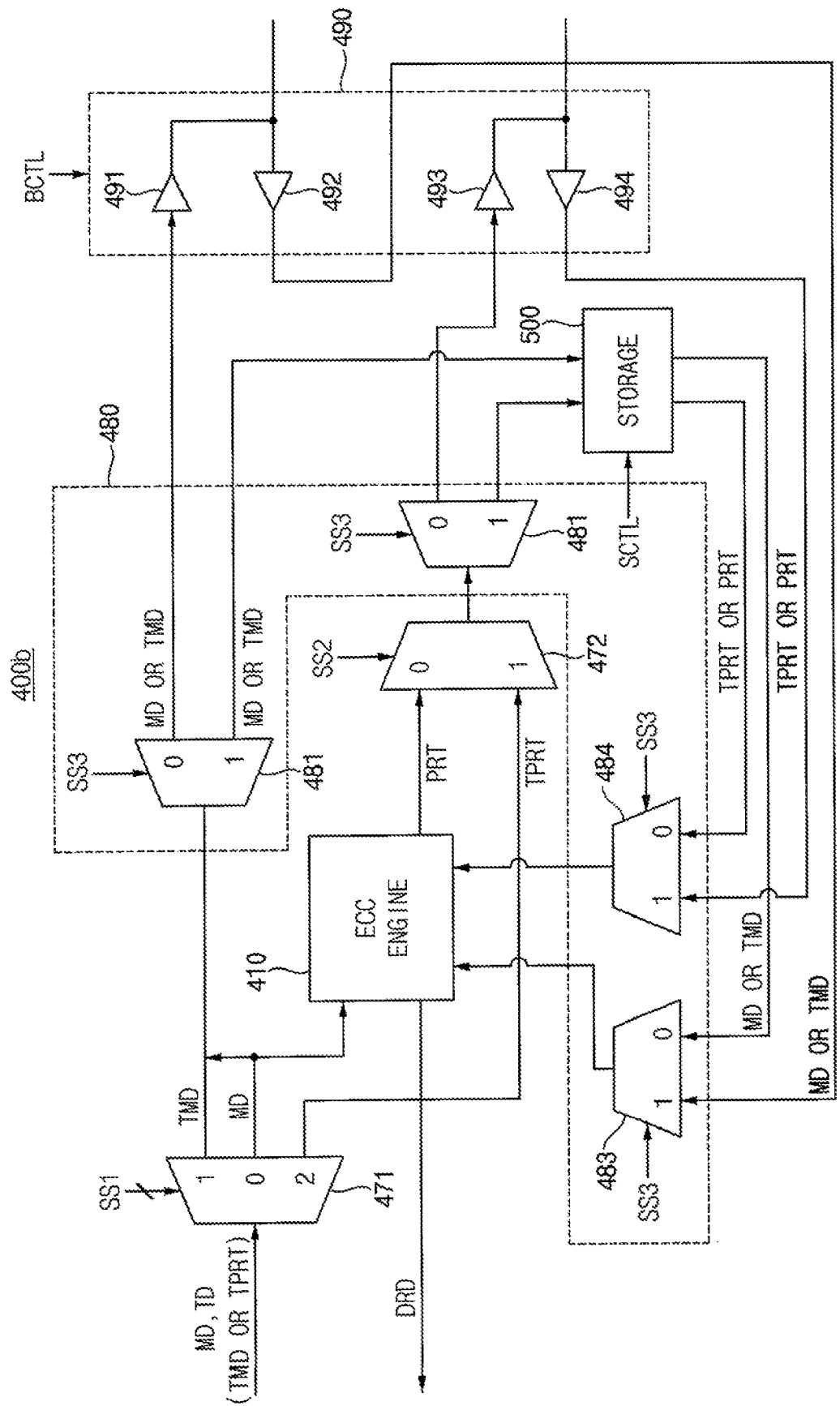
FIG. 11 is a block diagram illustrating another example of the ECC circuit in the semiconductor memory device of FIG. 5 according to example embodiments.

FIG. 11 is a block diagram illustrating another example of the ECC circuit in the semiconductor memory device of FIG. 5 according to example embodiments.

Referring to FIG. 11, an ECC circuit 400b may include an ECC engine 410, a demultiplexer 471, a multiplexer 472, a path selection circuit 480, a buffer circuit 490, and a storage 500.

The ECC circuit 400b of FIG. 11 differs from the ECC circuit 400a of FIG. 7 in that the ECC circuit 400b further includes the path selection circuit 480 and the storage 500, and stores the main data MD, the parity data PRT, the test main data TMD, and the test parity data TPRT in one of the memory cell array 300 and the storage 500.

The path selection circuit 480 may include demultiplexers 481 and 482 and multiplexers 483 and 484.

The demultiplexer 481 may receive the main data MD from the demultiplexer 471 in the normal mode, and receive the test main data TMD from the demultiplexer 471 in the second sub test mode. The demultiplexer 481 may provide the buffer 491 with the main data MD or the test main data TMD in a first storage mode and may provide the storage 500 with the main data MD or the test main data TMD in a second storage mode, in response to a third selection signal SS3.

The demultiplexer 482 may receive the parity data PRT from the multiplexer 472 in the normal mode, and receive the test parity data from the multiplexer 472 in the second sub test mode. The demultiplexer 482 may provide the buffer 493 with the parity data PRT or the test parity data TPRT in the first storage mode and may provide the storage 500 with the parity data PRT or the test parity data TPRT in the second storage mode, in response to the third selection signal SS3.

The storage 500 may output the main data MD and the test parity data TPRT or output the test main data TMD and the parity data PRT to the path selection circuit 480 in response to a control signal SCTL.

The multiplexer 483 may receive the main data MD or the test main data TMD from the buffer 494 in the first storage mode, and receive the main data MD or the test main data TMD from the storage 500 in the second storage mode. The multiplexer 483 may provide the main data MD to the ECC engine 410 in the first sub test mode and provide the test main data TMD to the ECC engine 410 in the second sub test mode, in response to the third selection signal SS3.

The multiplexer 484 may receive the parity data PRT or the test parity data TPRT from the buffer 492 in the first storage mode, and receive the parity data PRT or the test parity data TPRT from the storage 500 in the second storage mode. The multiplexer 484 may provide the test parity data TPRT to the ECC engine 410 in the first sub test mode and provide the parity data PRT to the ECC engine 410 in the second sub test mode, in response to the third selection signal SS3.

The ECC engine 410, in the first sub test mode, may perform the ECC decoding on the main data MD read from the normal cell region NCA or the storage 500 and the test parity data TPRT read from the parity cell region PCA or the storage 500 to generate the decoding result data DRD, and may provide the decoding result data DRD to the memory controller 100 through the data I/O buffer 295.

The ECC engine 410, in the second sub test mode, may perform the ECC decoding on the test main data TMD read from the normal cell region NCA or the storage 500 and the parity data PRT read from the parity cell region PCA or the storage 500 to generate the decoding result data DRD, and may provide the decoding result data DRD to the memory controller 100 through the data I/O buffer 295.

When the main data MD, the parity data PRT, the test main data TMD, and the test parity data TPRT are stored in the memory cell array 300, the decoding result data DRD may indicate an error pattern generated in the memory cell array 300 by using the intentional error bit.

When the main data MD, the parity data PRT, the test main data TMD, and the test parity data TPRT are stored in the storage 500, the decoding result data DRD may indicate error pattern generated in the ECC engine 410 by using the intentional error bit.

In FIG. 11, the first selection signal SS1, the second selection signal SS2, the third selection signal SS3, the control signal SCTL, and the buffer control signal BCTL may be included in the second control signal CTL2 in FIG. 5.

Figure 12:
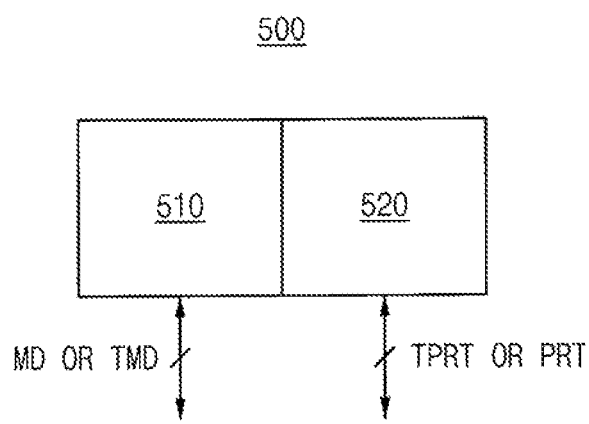
FIG. 12 is a block diagram illustrating an example of the storage in FIG. 11 according to example embodiments.

FIG. 12 is a block diagram illustrating an example of the storage in FIG. 11 according to example embodiments.

Referring to FIG. 12, the storage 500 may include a first region 510 and a second region 520.

The first region 510 may be referred to as a normal region, and may store the main data MD in the normal mode. The main data MD may be read from the first region 510 in the first sub test mode, and the test main data TMD may be stored in and be read from the first region 510 in the second sub test mode.

The second region 520 may be referred to as a parity region, and may store the parity data PRT in the normal mode. The test parity data TPRT may be stored in and be read from the second region 520 in the first sub test mode, and the parity data PRT may be stored in and read from the second region 520 in the second sub test mode.

FIG. 13 illustrates second data bits that may be stored in the error injection register set in FIG. 4.

Referring to FIG. 13, second data bits V having a first logic level as a default logic level may be stored in the error injection registers 14l~14k in the error injection register set 140. The register write circuit 150 may change at least one of the second data bits V to a second logic level such that the test data TD_SG1~TD_SGk representing various error patterns may be provided to the semiconductor memory device 200.

The memory controller 100 may analyze an error pattern of the decoding result data DRD, and may log error information associated with the error pattern in the error log register 160.

FIGS. 14 through 16 illustrate various error patterns that the error injection register set may represent according to example embodiments.

FIG. 14 illustrates a single bit error.

Referring to FIG. 14, only one of the second data bits EB_BL_SG1~EB_BL_SGk has a logic high level. Therefore, the error pattern of FIG. 14 represents a single bit error.

FIG. 15 illustrates a double bit error.

Referring to FIG. 15, two of the second data bits EB_BL_SG1~EB_BL_SGk have a logic high level. Therefore, the error pattern of FIG. 15 represents a double bit error.

FIG. 16 illustrates an error pattern associated with a data pad.

Referring to FIG. 16, all data bits associated with a data I/O pad DQ1 of the second data bits EB_BL_SG1~EB_BL_SGk have a logic high level. Therefore, the error pattern of FIG. 16 represents an error pattern associated with a data I/O pad.

In addition, the error injection register set of FIG. 13 may represent various error patterns such a symbol error pattern.

Figure 17:
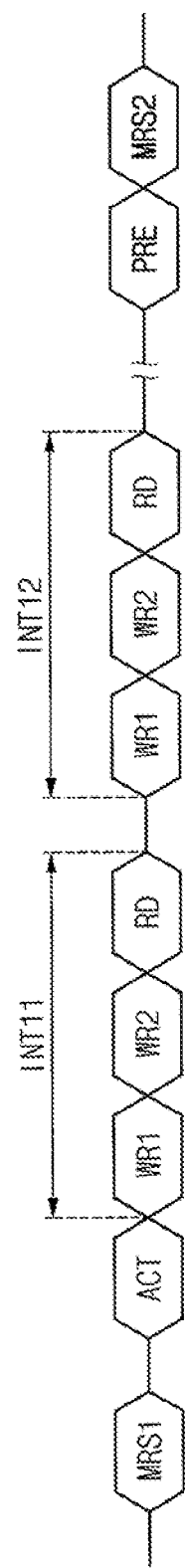
FIG. 17 illustrates a command sequence that the semiconductor memory device receives in an error injection test mode according to example embodiments.

FIG. 17 illustrates a command sequence that the semiconductor memory device receives in an error injection test mode according to example embodiments.

Referring to FIGS. 5 and 17, the mode register 212 may be set to an error injection test entry mode in response to a first mode register set command MRS1.

A target word-line in the memory cell array may be activated in response to an active command ACT, the main data MD accompanied by a first write command WR1 (a first command) may be provided to the ECC circuit 400, and the parity data PRT may be generated and the main data MD and the parity data PRT may be stored in the normal cell region and the parity cell region coupled to the target word-line, respectively.

The test data TD including at least one error bit accompanied by a second write command WR2 (a second command) may be provided to the ECC circuit 400, and the test data TD may be stored in one of the in the normal cell region and the parity cell region coupled to the target word-line.

One of the main data MD and the parity data PRT and the test data TD may be read in response to a read command RD, and the ECC circuit 400 may perform an ECC decoding on one of the main data MD and the parity data PRT and the test data TD to generate the decoding result data DRD and provide the decoding result data DRD to the memory controller 100.

The first write command WR1, the second write command WR2, and the read command RD during a first interval INT11 indicate that an error injection test is performed on a codeword stored in a target page of the target word-line.

The first write command WR1, the second write command WR2, and the read command RD during a second interval INT12 indicate that an error injection test is performed on another codeword stored in a target page of the target word-line.

When the error injection test is repeatedly performed on the codewords and the error injection test on all codewords is completed, the target word-line may be precharged in response to a precharge command PRE and the mode register 212 may be set to an error injection test exit mode in response to a second mode register set command MRS2.

Although the semiconductor memory device 200 may be set to the error injection test mode by setting the mode register 212 in FIG. 17, the error injection test mode of the semiconductor memory device 200 may be executed by setting a test mode register set or a specified command sequence.

Figure 18:
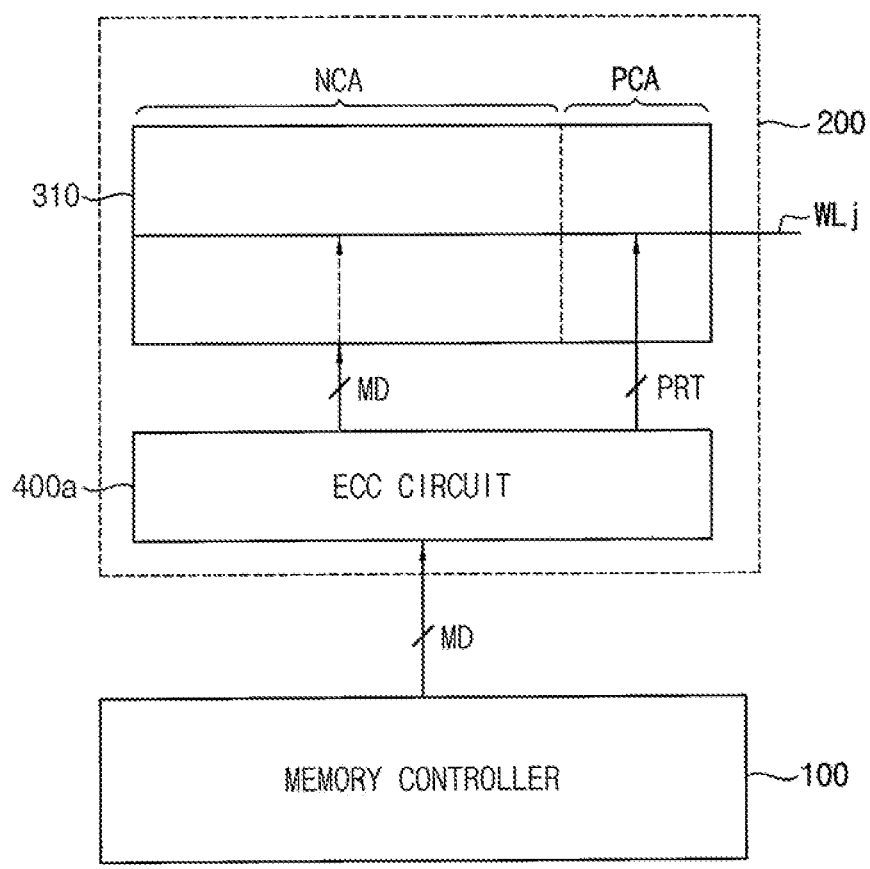
FIGS. 18 through 20 illustrate that data is exchanged between the memory controller and the semiconductor memory device in the memory system of FIG. 1, respectively.
Figure 19:
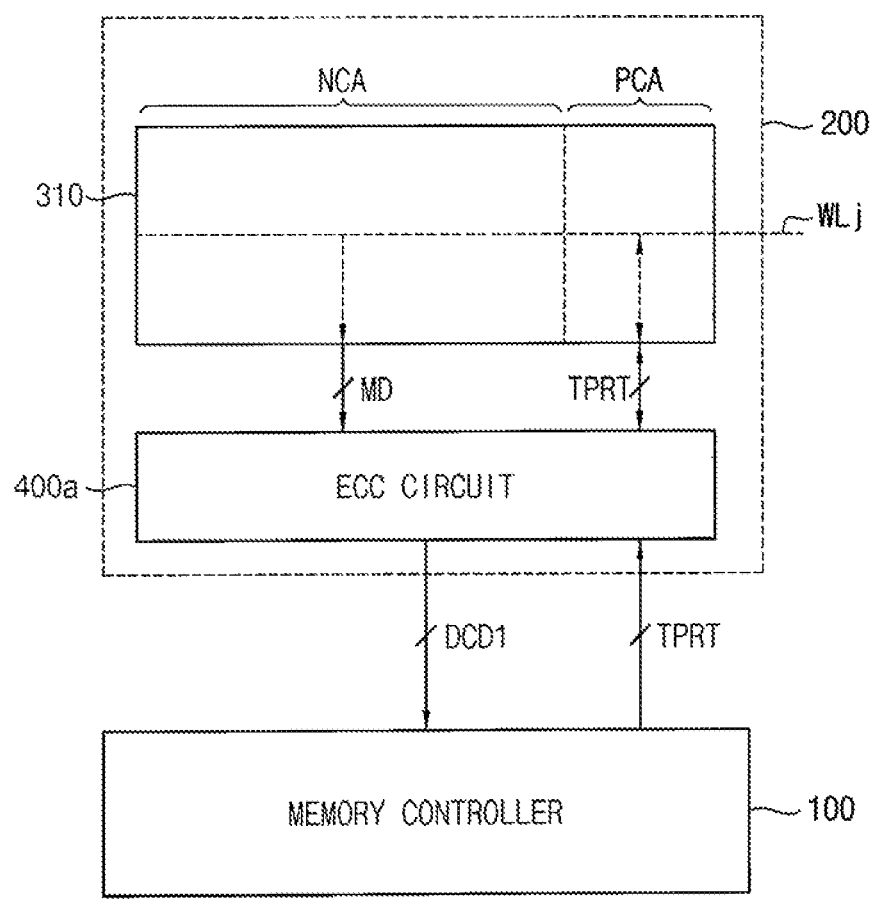
Figure 20:
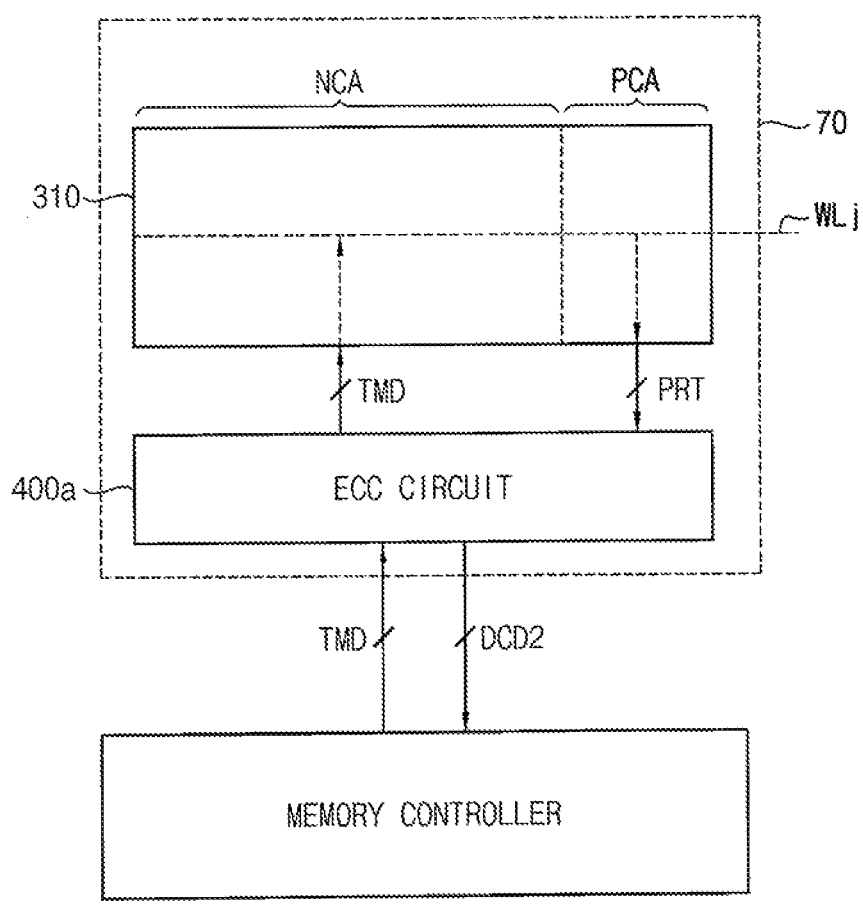

FIGS. 18 through 20 illustrate that data is exchanged between the memory controller and the semiconductor memory device in the memory system of FIG. 1, respectively.

Referring to FIGS. 18 through 20, the first bank array 310 of the memory cell array 300 may include a normal cell region NCA and a parity cell region PCA.

In FIGS. 18 through 20, it is assumed that data is stored in memory cells coupled to a word-line WLj in the normal cell region NCA and the parity cell region PCA.

FIG. 18 illustrates the memory system of FIG. 1 in the normal mode.

Referring to FIG. 18, when the main data MD accompanied by a first command (a first write command) is provided from the memory controller 100 in the normal mode, the ECC circuit 400a may perform an ECC encoding on the main data MD to generate the parity data PRT and may store the main data MD and the parity data PRT in the normal cell region NCA and the parity cell region PCA of the first bank array 310, respectively.

FIG. 19 illustrates the memory system of FIG. 1 when the test mode designates the first sub test mode.

Referring to FIG. 19, when the test mode designates the first sub test mode, the memory controller 100 may transmit the test parity data TPRT including at least one error bit to the semiconductor memory device 200 and the semiconductor memory device 200 may receive the test parity data TPRT through a first data I/O pad through which the semiconductor memory device 200 receives the main data MD. The ECC circuit 400a may store the test parity data TPRT accompanied by a second command (a second write command) in a memory location in which the parity data PRT is stored in the parity cell region PCA.

The ECC circuit 400a may read the main data MD and the test parity data TPRT from the normal cell region NCA and the parity cell region PCA, respectively, in response to a read command, may perform an ECC decoding on the main data MD and the test parity data TPRT to generate a decoding result data DRD1, and may transmit the decoding result data DRD1 to the memory controller 100 through the first data I/O pad.

The memory controller 100 may analyze a code of the ECC circuit 400a based on the decoding result data DRD1 when the parity data includes an error bit, and may provide an external host with a result of the analysis.

FIG. 20 illustrates the memory system of FIG. 1 when the test mode designates the second sub test mode.

Referring to FIG. 20, when the test mode designates the second sub test mode, the memory controller 100 may transmit the test main data TMD including at least one error bit to the semiconductor memory device 200, and the semiconductor memory device 200 may receive the test main data TMD through a first data I/O pad through which the semiconductor memory device 200 receives the main data MD. The ECC circuit 400a may store the test main data TMD accompanied by a second command (a second write command) in a memory location in which the main data MD is stored in the normal cell region NCA.

The ECC circuit 400a may read the test main data TMD and the parity data PRT from the normal cell region NCA and the parity cell region PCA, respectively, in response to a read command, may perform an ECC decoding on the test main data TMD and the parity data PRT to generate a decoding result data DRD2, and may transmit the decoding result data DRD2 to the memory controller 100 through the first data I/O pad.

The memory controller 100 may analyze code of the ECC circuit 400a based on the decoding result data DRD2 when the parity data includes an error bit, and may provide an external host with a result of the analysis.

Figure 21:
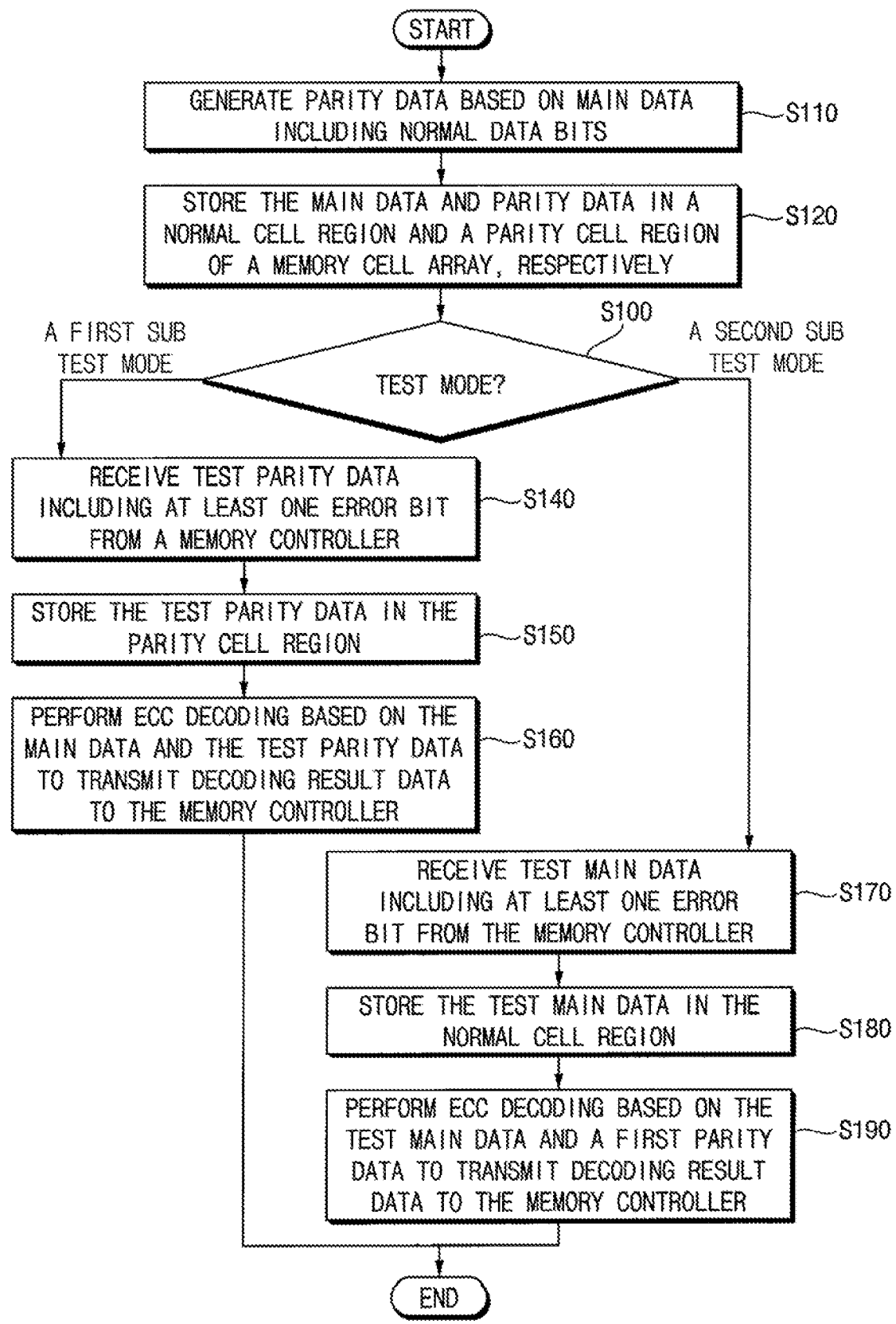
FIG. 21 is a flow chart illustrating a method of operating a semiconductor memory device according to example embodiments.

FIG. 21 is a flow chart illustrating a method of operating a semiconductor memory device according to example embodiments.

Referring to FIGS. 1 and 5 through 21, in a method of operating a semiconductor memory device 200 including a memory cell array 300 that includes a normal cell region NCA and a parity cell region PCA, the semiconductor memory device 200 may receive a main data MD including normal bits, accompanied by a first command, from a memory controller 100. An ECC circuit 400 in the semiconductor memory device 200 may generate parity data PRT based on the main data MD (by performing an ECC encoding on the main data MD) (operation S110).

The ECC circuit 400a may store the main data MD and the parity data PRT in the normal cell region NCA and the parity cell region PCA, respectively (operation S120).

A control logic circuit 210 in the semiconductor memory device 200 may determine whether a test mode designates either a first sub test mode or a second sub test mode (operation S130).

When the test mode designates the first sub test mode, the semiconductor memory device 200 may receive a test parity data TPRT including at least one error bit through a first data I/O pad through which the semiconductor memory device 200 receives the main data MD from the memory controller 100 (operation S140).

The ECC circuit 400a may store the test parity data TPRT in a memory location in which the parity data PRT is stored in the parity cell region PCA (operation S150).

The ECC circuit 400a may read the main data MD and the test parity data TPRT from the normal cell region NCA and the parity cell region PCA, respectively, in response to a read command, and may perform an ECC decoding on the main data MD and the test parity data TPRT to transmit a decoding result data DRD to the memory controller 100 (operation S160).

When the test mode designates the second sub test mode, the semiconductor memory device 200 may receive a test main data TMD including at least one error bit through a first data I/O pad through which the semiconductor memory device 200 receives the main data MD from the memory controller 100 (operation S170).

The ECC circuit 400*a* may store the test main data TMD in a memory location in which the main data MD is stored in the normal cell region NCA (operation S180).

The ECC circuit 400*a* may read the test main data TMD and the parity data PRT from the normal cell region NCA and the parity cell region PCA, respectively, in response to a read command, and may perform an ECC decoding on the test main data TMD and the parity data PRT to transmit a decoding result data DRD to the memory controller 100 (operation S190).

In a semiconductor memory device and a memory system according to example embodiments, the memory system may inject at least one error bit in the main data or the parity data in the error injection test mode, and the ECC circuit in the semiconductor memory device may perform an ECC decoding on the data in which the at least one error bit is injected to generate a decoding result data, and transmit the decoding result data to the memory controller. The memory controller may analyze an ECC in the semiconductor memory device based on the decoding result data when various error patterns are implemented in the main data or the parity data.

Figure 22:
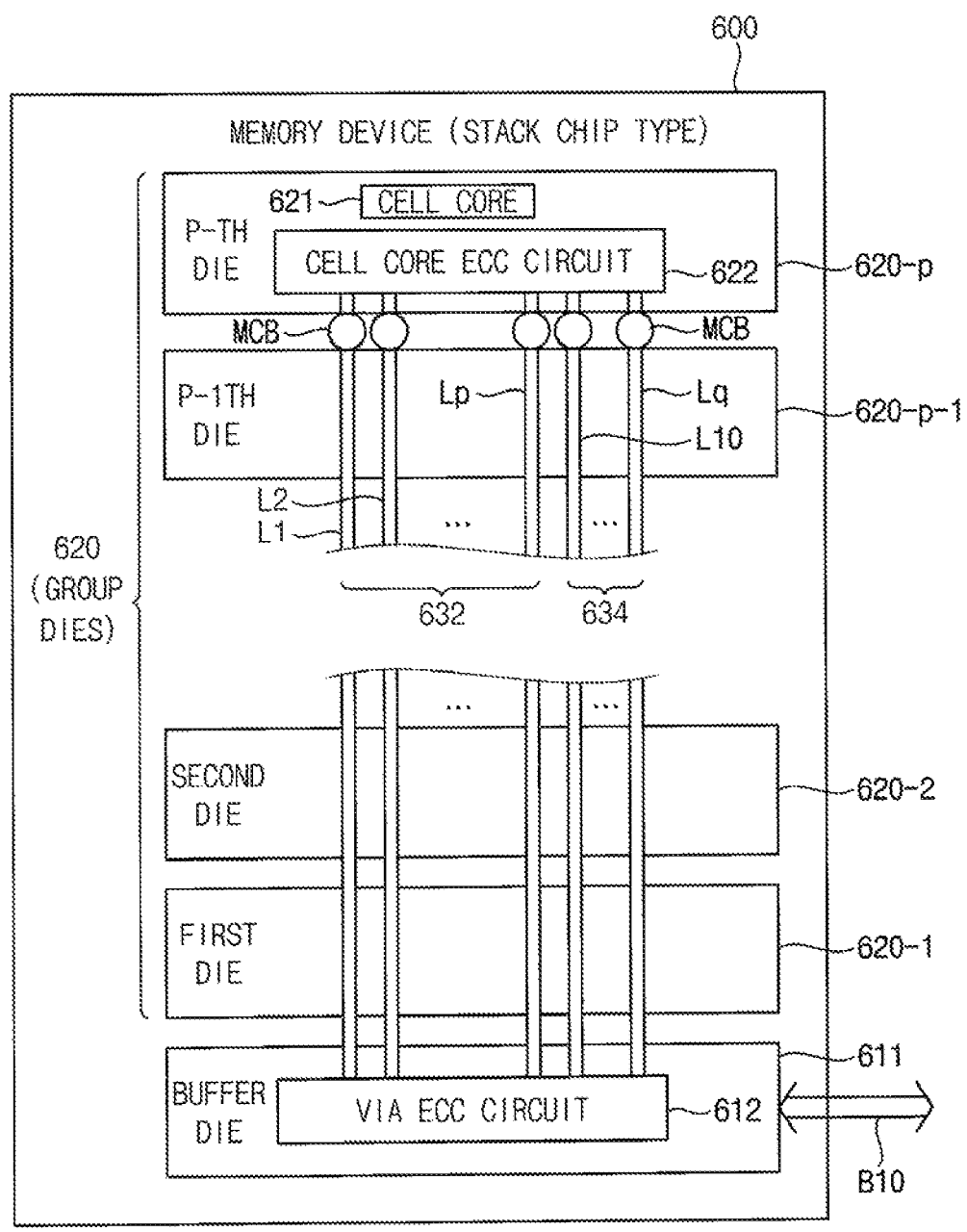
FIG. 22 is a block diagram illustrating a semiconductor memory device according to example embodiments.

FIG. 22 is a block diagram illustrating a semiconductor memory device according to example embodiments.

Referring to FIG. 22, a semiconductor memory device 600 may include at least one buffer die 611 and group dies 620 providing a soft error analyzing and correcting function in a stacked chip structure.

The group dies 620 may include a plurality of memory dies 620-1 to 620-*p* stacked on the at least one buffer die 611, and may convey data through a plurality of through silicon via (TSV) lines.

Each of the memory dies 620-1 to 620-*p* may include a cell core 621 (which includes a normal cell region and a parity cell region, and stores data) and a cell core ECC circuit 622 (which generates transmission parity bits (i.e., transmission parity data) based on transmission data to be sent to the at least one buffer die 610). The cell core ECC circuit 622 may employ the ECC circuit 400*a* of FIG. 7 or the ECC circuit 400*b* of FIG. 11.

The cell core ECC circuit 622, in an error injection test mode, may receive main data or parity data that includes at least one error bit, may store test parity data in a parity cell region in a first sub test mode, and may store test main data in a normal cell region in a second sub test mode.

The cell core ECC circuit 622 may read the data in which the error bit is injected, may perform ECC decoding on the main data and the parity data in one of which at least one error bit is injected to generate a decoding result data, and may transmit the decoding result data to the memory controller 100. The memory controller 100 may analyze an ECC in the semiconductor memory device 600 based on the decoding result data when various error patterns are implemented in the main data or the parity data.

The at least one buffer die 610 may include a via ECC circuit 612 that corrects a transmission error using the transmission parity bits when a transmission error is detected from the transmission data received through the TSV liens, and generates error-corrected data.

The semiconductor memory device 600 may be a stack chip type memory device or a stacked memory device that conveys data and control signals through the TSV lines. The TSV lines may be also called 'through electrodes'.

The cell core ECC circuit 622 may perform error correction on data that is output from the memory die 620-*p* before the transmission data is sent.

A transmission error that occurs at the transmission data may be due to noise that occurs at the TSV lines. Since data fail due to the noise occurring at the TSV lines may be distinguishable from data fail due to a false operation of the memory die, it may be regarded as soft data fail (or a soft error). The soft data fail may be generated due to a transmission fail on a transmission path, and may be detected and remedied by an ECC operation.

A data TSV line group 632 that is formed at one memory die 620-*p* may include TSV lines L1 to Lp, and a parity TSV line group 634 may include TSV lines L10 to Lq. The TSV lines L1 to Lp of the data TSV line group 632 and the parity TSV lines L10 to Lq of the parity TSV line group 634 may be connected to micro bumps MCB that are correspondingly formed among the memory dies 620-1 to 620-*p*.

Each of the memory dies 620-1 to 620-*p* may include DRAM cells, each including at least one access transistor and one storage capacitor.

The semiconductor memory device 600 may have a three-dimensional (3D) chip structure or a 2.5D chip structure to communicate with the host through a data bus B10. The buffer die 611 may be connected with the memory controller through the data bus B10.

The cell core ECC circuit 622 may output transmission parity data as well as the transmission data through the parity TSV line group 634 and the data TSV line group 632, respectively. The output transmission data may be data that is error-corrected by the cell core ECC circuit 622.

The via ECC circuit 612 may determine whether a transmission error occurs at the transmission data received through the data TSV line group 632, based on the transmission parity data received through the parity TSV line group 634. When a transmission error is detected, the via ECC circuit 612 may correct the transmission error on the transmission data using the transmission parity data. When the transmission error is uncorrectable, the via ECC circuit 612 may output information indicating occurrence of an uncorrectable data error.

When an error is detected from read data in a high bandwidth memory (HBM) or the stacked memory structure, the error may be an error occurring due to noise while data is transmitted through the TSV. According to example embodiments, as illustrated in FIG. 22, the cell core ECC circuit 622 may be included in the memory die, and the via ECC circuit 612 may be included in the buffer die 610. Accordingly, it may be possible to detect and correct a soft data fail. The soft data fail may include a transmission error that is generated due to noise when data is transmitted through TSV lines.

Figure 23:
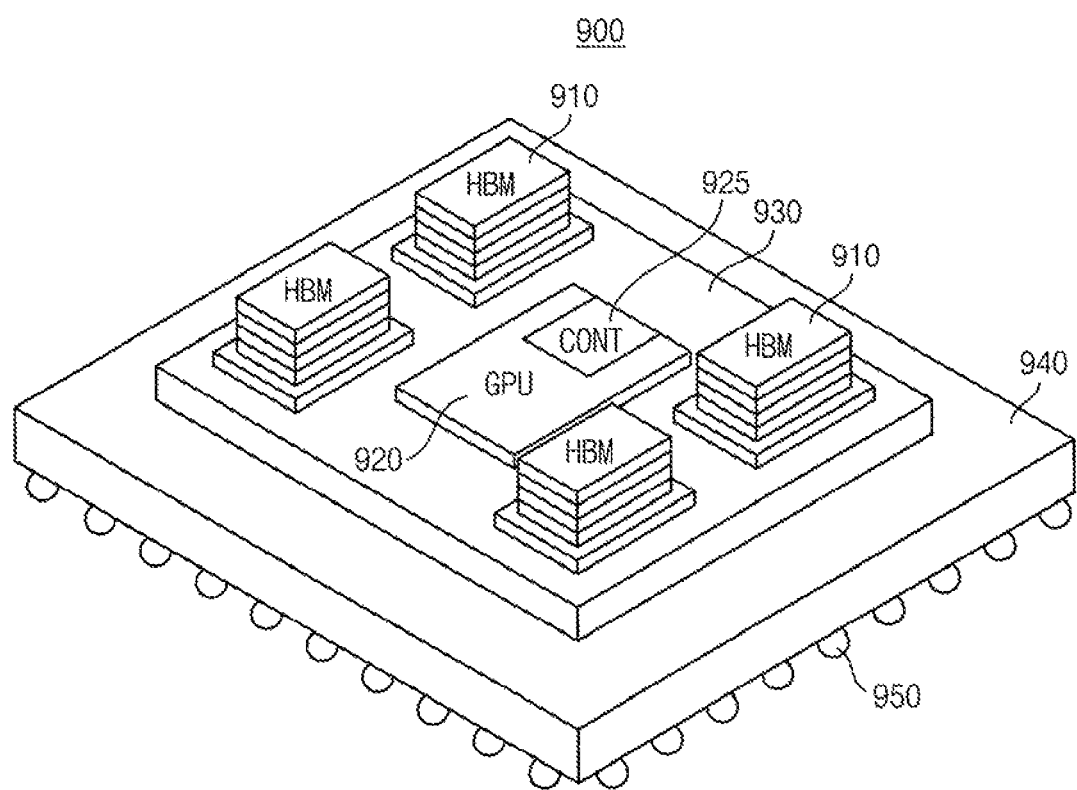
FIG. 23 is a diagram illustrating a semiconductor package including the stacked memory device, according to example embodiments.

FIG. 23 is a diagram illustrating a semiconductor package including the stacked memory device, according to example embodiments.

Referring to FIG. 23, a semiconductor package 900 may include one or more stacked memory devices 910 and a graphic processing unit (GPU) 920. The GPU 920 may include a memory controller 925.

The stacked memory devices 910 and the GPU 920 may be mounted on an interposer 930, and the interposer may be mounted on a package substrate 940. The package substrate 940 may be mounted on solder balls 950. The memory controller 925 may employ the memory controller 100 in FIG. 1.

Each of the stacked memory devices 910 may be implemented in various forms, and may be a memory device in a high bandwidth memory (HBM) form in which a plurality of layers are stacked. Each of the stacked memory devices 910 may include a buffer die and a plurality of memory dies. Each of the memory dies may include a memory cell array and an ECC circuit.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions.

By way of summation and review, due to continuing shrink in a fabrication design rule of DRAMs, bit errors of memory cells in the DRAMs may increase and yield of the DRAMs may decrease.

As described above, in a semiconductor memory device and a memory system according to example embodiments, the memory system may inject at least one error bit in the main data or the parity data in the error injection test mode, the ECC circuit in the semiconductor memory device may perform an ECC decoding on the data in which the at least one error bit is injected to generate a decoding result data, and may transmit the decoding result data to the memory controller. The memory controller may analyze an ECC in the semiconductor memory device based on the decoding result data when various error patterns are implemented in the main data or the parity data.

Embodiments may be applied to systems using semiconductor memory devices that employ an ECC circuit. For example, embodiments may be applied to systems such as be a smart phone, a navigation system, a notebook computer, a desk top computer and a game console that use the semiconductor memory device as a working memory.

Embodiments may provide a semiconductor memory device capable of performing an error injection test. Embodiments may provide a memory system capable of performing an error injection test.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
a memory cell array including a plurality of volatile memory cells coupled to a plurality of word-lines and a plurality of bit-lines, the memory cell array including a normal cell region and a parity cell region;
an error correction code (ECC) circuit that is selectively operable in a normal mode and a test mode; and
a control logic circuit configured to control the ECC circuit,
wherein, in the normal mode, the ECC circuit is configured to:
receive a main data including normal data bits from an external device, the main data accompanied by a first command;
using an ECC engine, perform an ECC encoding on the main data to generate a parity data; and
store the main data and the parity data, received from the ECC engine, in the normal cell region and the parity cell region, respectively, and
wherein, in the test mode, the ECC circuit is configured to:
receive a test data including at least one error bit from the external device, the test data accompanied by a second command;
bypass the ECC engine to store the test data in the parity cell region, in a first sub test mode;
bypass the ECC engine to store the test data in one of the normal cell region, in a second sub test mode; and
perform an ECC decoding on the test data and one of the main data and the parity data in response to a read command to provide a decoding result data to the external device.

2. The semiconductor memory device as claimed in claim 1, wherein the ECC circuit is configured to receive the main data and the test data through a same data input/output pad.

3. The semiconductor memory device as claimed in claim 1, wherein when the test mode designates the first sub test mode, the ECC circuit is configured to:
receive a test parity data including the at least one error bit as the test data;
store the test parity data in a memory location in which the parity data is stored, in the parity cell region;
read the main data and the test parity data in response to a read command; and
perform the ECC decoding on the main data and the test parity data to output the decoding result data.

4. The semiconductor memory device as claimed in claim 1, wherein when the test mode designates the second sub test mode, the ECC circuit is configured to:
receive a test main data including the at least one error bit as the test data;
store the test main data in a memory location in which the main data is stored, in the normal cell region;
read the test main data and the parity data in response to a read command; and
perform the ECC decoding on the test main data and the parity data to output the decoding result data.

5. The semiconductor memory device as claimed in claim 4, wherein the at least one error bit includes one of a single bit error, a double bit error, a symbol error, and a data input/output pad error.

6. The semiconductor memory device as claimed in claim 1, wherein the second command is activated by a setting a test mode register set.

7. The semiconductor memory device as claimed in claim 1, wherein the test mode is set by one of a mode register set command, a test mode register set command, and a specified command sequence from the external device.

8. The semiconductor memory device as claimed in claim 1, wherein the ECC circuit includes:
an ECC engine configured to perform the ECC encoding to generate the parity data in the normal mode and configured to perform the ECC decoding to generate the decoding result data in the test mode;
a demultiplexer configured to, in response to a first selection signal, provide the main data to the ECC engine in the normal mode and select one of a test main data including the at least one error bit and a test parity data including the at least one error bit in the test mode;
a multiplexer configured to select one of the parity data and the test parity data in response to a second selection signal; and
a buffer circuit configured to provide the main data and the parity data to the memory cell array in the normal mode and configured to provide one of the test main data and the test parity data to the memory cell array in the test mode.

9. The semiconductor memory device as claimed in claim 8, wherein the demultiplexer is configured to select the parity data in the normal mode and select the test parity data in the test mode, in response to the second selection signal.

10. The semiconductor memory device as claimed in claim 8, wherein the ECC engine is configured to:
perform the ECC decoding on the main data and the test parity data to output the decoding result data when the test mode designates a first sub test mode; and
perform the ECC decoding on the test main data and the parity data to output the decoding result data when the test mode designates a second sub test mode.

11. The semiconductor memory device as claimed in claim 8, wherein the ECC engine includes:
a memory to store an ECC;
an ECC encoder, coupled to the memory, configured to generate the parity data to generate the parity data; and
an ECC decoder, coupled to the memory, configured to perform the ECC decoding on the main data and the test parity data to generate the decoding result data when the test mode designates a first sub test mode, and perform the ECC decoding on the test main data and the parity data to generate the decoding result data when the test mode designates a second sub test mode.

12. The semiconductor memory device as claimed in claim 1, wherein the ECC circuit is configured to verify an ECC included in the ECC circuit based on the at least one error bit in the test mode.

13. The semiconductor memory device as claimed in claim 1, comprising:
at least one buffer die; and
a plurality of memory dies, the plurality of memory dies stacked on the at least one buffer die and conveying data through a plurality of through silicon via (TSV) lines,
wherein each of the plurality of memory dies includes the memory cell array and the ECC circuit.

14. A semiconductor memory device, comprising:
a memory cell array including a plurality of volatile memory cells coupled to a plurality of word-lines and a plurality of bit-lines, the memory cell array including a normal cell region and a parity cell region;
an error correction code (ECC) circuit including a storage, the ECC circuit being selectively operable in a normal mode and a test mode; and
a control logic circuit configured to control the ECC circuit,
wherein, in the normal mode, the ECC circuit is configured to:
receive a main data including normal data bits from an external device, the main data accompanied by a first command;
using an ECC engine, perform an ECC encoding on the main data to generate a parity data; and
store the main data and the parity data, received from the ECC engine, in a selected one of the storage and the memory cell array, and
wherein, in the test mode, the ECC circuit is configured to:
receive a test data including at least one error bit from the external device, the test data accompanied by a second command;
bypass the ECC engine to store the test data in the storage and the memory cell array; and
perform an ECC decoding on the test data and one of the main data and the parity data in response to a read command to provide a decoding result data to the external device.

15. The semiconductor memory device as claimed in claim 1, wherein the ECC circuit is configured to receive the main data and the test data through a same data input/output pad.

16. The semiconductor memory device as claimed in claim 14, wherein the ECC circuit is configured to:
when the test mode designates a first sub test mode,
receive a test parity data including the at least one error bit as the test data;
store the test parity data in a memory location in which the parity data is stored, in a parity cell region of the selected one of the storage and the memory cell array;
read the main data and the test parity data in response to a read command; and
perform the ECC decoding on the main data and the test parity data to output the decoding result data, and
when the test mode designates a second sub test mode,
receive a test main data including the at least one error bit as the test data;
store the test main data in a memory location in which the main data is stored, in a normal cell region of the selected one of the storage and the memory cell array;
read the test main data and the parity data in response to the read command; and
perform the ECC decoding on the test main data and the parity data to output the decoding result data.

17. The semiconductor memory device as claimed in claim 14, wherein the ECC circuit includes:
an ECC engine configured to perform the ECC encoding to generate the parity data in the normal mode and perform the ECC decoding to generate the decoding result data in the test mode;
a multiplexer configured to, in response to a first selection signal, provide the main data to the ECC engine in the normal mode, and select one of a test main data including the at least one error bit and a test parity data including the at least one error bit in the test mode;
a demultiplexer configured to select one of the parity data and the test parity data in response to a second selection signal;
a buffer circuit, connected to the memory cell array; and
a path selection circuit configured to provide the main data and the parity data, or the test main data and the test parity data, to one of the buffer circuit and the storage in response to a third selection signal.

18. A memory system, comprising:
a semiconductor memory device; and
a memory controller configured to control the semiconductor memory device, wherein the semiconductor memory device includes:
  a memory cell array including a plurality of volatile memory cells coupled to a plurality of word-lines and a plurality of bit-lines, the memory cell array including a normal cell region and a parity cell region;
  an error correction code (ECC) circuit that is selectively operable in a normal mode and a test mode; and
  a control logic circuit configured to control the ECC circuit, wherein, in the normal mode, the ECC circuit is configured to:
  receive a main data including normal data bits from the memory controller, the main data accompanied by a first command;
  using an ECC engine, perform an ECC encoding on the main data to generate a parity data; and
  store the main data and the parity data, received from the ECC engine, in the normal cell region and the parity cell region, respectively, and
wherein, in the test mode, the ECC circuit is configured to:
  receive a test data including at least one error bit from the memory controller, the test data accompanied by a second command;
  bypass the ECC engine to store the test data in the parity cell region, in a first sub test mode;
  bypass the ECC engine to store the test data in one of the normal cell region, in a second sub test mode; and
  perform an ECC decoding on the test data and one of the main data and the parity data in response to a read command to provide a decoding result data to the memory controller.

19. The memory system as claimed in claim 18, wherein the memory controller includes:
  an error injection register set configured to store an error bit set including at least one error bit, the error bit set being associated with a data set to be provided to the semiconductor memory device;
  a data buffer configured to store the main data to be provided to the semiconductor memory device;
  a test data generator configured to generate the test data to be provided to the semiconductor memory device based on the data set and the error bit set;
  a multiplexer configured to select one of the main data and the test data in response to a mode signal;
  an error log register; and
  a central processing unit (CPU) configured to control the error injection register set, the data buffer, and the test data generator, and
  wherein the CPU is configured to analyze the decoding result data to record error information based on the at least one error bit in the error log register.

20. The memory system as claimed in claim 19,
  wherein the data buffer includes a plurality of input registers, and each of the input registers is configured to store a first unit of first data bits corresponding to a burst length of the semiconductor memory device, and
  wherein the error injection register set includes:
  a plurality of error injection registers, and each of the error injection registers is configured to store a second unit of second data bits corresponding to the first data bits of the first unit; and
  a register write circuit configured to change a logic level of one of the second data bits in response to a control of the CPU, in the test mode.

* * * * *